(12) United States Patent
Garcia

(10) Patent No.: US 11,323,095 B2
(45) Date of Patent: May 3, 2022

(54) ROTATION IN XY PLANE TO SUPPRESS SPURIOUS MODES IN XBAR DEVICES

(71) Applicant: Resonant Inc., Goleta, CA (US)

(72) Inventor: Bryant Garcia, Burlingame, CA (US)

(73) Assignee: Resonant Inc., Austin, TX (US)

( * ) Notice: Subject to any disclaimer, the term of this patent is extended or adjusted under 35 U.S.C. 154(b) by 206 days.

(21) Appl. No.: 16/885,163

(22) Filed: May 27, 2020

(65) Prior Publication Data
US 2020/0287521 A1    Sep. 10, 2020

Related U.S. Application Data

(63) Continuation-in-part of application No. 16/689,707, filed on Nov. 20, 2019, now Pat. No. 10,917,070, (Continued)

(51) Int. Cl.
*H03H 9/56*    (2006.01)
*H03H 9/02*    (2006.01)
(Continued)

(52) U.S. Cl.
CPC ........ *H03H 9/568* (2013.01); *H03H 9/02015* (2013.01); *H03H 9/02031* (2013.01); (Continued)

(58) Field of Classification Search
CPC .............. H03H 9/568; H03H 9/02015; H03H 9/02031; H03H 9/02062; H03H 9/02228; (Continued)

(56) References Cited

U.S. PATENT DOCUMENTS 5,446,330 A    8/1995 Eda et al.
5,552,655 A    9/1996 Stokes et al.
(Continued)

FOREIGN PATENT DOCUMENTS

WO    2016017104        2/2016
WO    2018003273 A1    1/2018

OTHER PUBLICATIONS

Sinha et al., "Slanted finger Inter-digital Transducers for the design of improved performance small shape factor mid-bandwidth SAW filters", IEEE MTT-S International Microwave and RF Conference, 2013. (Year: 2013).*
(Continued)

*Primary Examiner* — Hafizur Rahman
(74) *Attorney, Agent, or Firm* — SoCal IP Law Group LLP; Angelo Gaz

(57) ABSTRACT

Acoustic resonator devices, filter devices, and methods of fabrication are disclosed. An acoustic resonator includes a substrate having a surface and a single-crystal piezoelectric plate having front and back surfaces. The back surface is attached to the surface of the substrate except for a portion of the piezoelectric plate forming a diaphragm that spans a cavity in the substrate. An interdigital transducer (IDT) is formed on the front surface of the single-crystal piezoelectric plate such that interleaved fingers of the IDT are disposed on the diaphragm. The IDT is configured to excite a primary acoustic mode in the diaphragm in response to a radio frequency signal applied to the IDT. The interleaved fingers extend at an oblique angle to an Z crystalline axis of the piezoelectric plate.

15 Claims, 21 Drawing Sheets

Related U.S. Application Data which is a continuation of application No. 16/230,443, filed on Dec. 21, 2018, now Pat. No. 10,491,192.

(60) Provisional application No. 62/896,821, filed on Sep. 6, 2019, provisional application No. 62/753,815, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(51) Int. Cl.
*H03H 9/13* (2006.01)
*H03H 9/17* (2006.01)
*H01L 41/047* (2006.01)
*H03H 3/02* (2006.01)

(52) U.S. Cl.
CPC .... *H03H 9/02062* (2013.01); *H03H 9/02228* (2013.01); *H03H 9/132* (2013.01); *H03H 9/174* (2013.01); *H03H 9/176* (2013.01); *H03H 9/562* (2013.01); *H03H 9/564* (2013.01); *H01L 41/0477* (2013.01); *H03H 3/02* (2013.01); *H03H 9/02039* (2013.01); *H03H 2003/023* (2013.01)

(58) Field of Classification Search
CPC ........ H03H 9/132; H03H 9/174; H03H 9/176; H03H 9/562; H03H 9/564; H03H 3/02; H03H 9/02039; H03H 2003/023; H01L 41/0477
USPC .......................................................... 333/192
See application file for complete search history.

(56) References Cited

U.S. PATENT DOCUMENTS

| | | |
|---|---|---|
| 5,726,610 A | 3/1998 | Allen et al. |
| 5,853,601 A | 12/1998 | Krishaswamy |
| 6,377,140 B1 | 4/2002 | Ehara et al. |
| 6,516,503 B1 | 2/2003 | Ikada et al. |
| 6,540,827 B1 | 4/2003 | Levy et al. |
| 6,707,229 B1 | 3/2004 | Martin |
| 6,710,514 B2 | 3/2004 | Ikada et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto |
| 8,278,802 B1 | 10/2012 | Lee et al. |
| 8,294,330 B1 | 10/2012 | Abbott et al. |
| 8,344,815 B2 | 1/2013 | Yamanaka |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,130,145 B2 | 9/2015 | Martin et al. |
| 9,219,466 B2 | 12/2015 | Meltaus et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette |
| 10,187,039 B2 | 1/2019 | Komatsu et al. |
| 10,200,013 B2 | 2/2019 | Bower |
| 10,211,806 B2 | 2/2019 | Bhattacharjee |
| 10,284,176 B1 | 5/2019 | Solal |
| 10,491,192 B1 | 11/2019 | Plesski et al. |
| 10,601,392 B2 | 3/2020 | Plesski |
| 10,637,438 B2 | 4/2020 | Garcia |
| 10,644,674 B2 | 5/2020 | Takamine |
| 10,756,697 B2 | 8/2020 | Plesski |
| 10,790,802 B2 | 9/2020 | Yantchev |
| 10,797,675 B2 | 10/2020 | Plesski |
| 10,826,462 B2 | 11/2020 | Plesski |
| 10,868,512 B2 | 12/2020 | Garcia |
| 10,917,070 B2 | 2/2021 | Plesski |
| 2002/0079986 A1 | 6/2002 | Ruby et al. |
| 2002/0158714 A1 | 10/2002 | Kaitila et al. |
| 2002/0189062 A1 | 12/2002 | Lin et al. |
| 2003/0080831 A1 | 5/2003 | Naumenko et al. |
| 2003/0199105 A1 | 10/2003 | Kub et al. |
| 2004/0100164 A1 | 5/2004 | Murata |
| 2004/0261250 A1 | 12/2004 | Kadota et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi |
| 2010/0064492 A1 | 3/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto |
| 2011/0278993 A1 | 11/2011 | Iwamoto |
| 2012/0286900 A1 | 11/2012 | Kadota et al. |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0042417 A1 | 2/2015 | Onodera et al. |
| 2015/0319537 A1 | 11/2015 | Perois et al. |
| 2015/0333730 A1 | 11/2015 | Meltaus |
| 2016/0028367 A1 | 1/2016 | Shealy |
| 2016/0182009 A1 | 6/2016 | Bhattacharjee |
| 2017/0063332 A1 | 3/2017 | Gilbert et al. |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0273480 A1 | 9/2019 | Lin |
| 2019/0348966 A1 | 11/2019 | Campanella-Pineda |
| 2020/0036357 A1 | 1/2020 | Mimura |
| 2020/0235719 A1 | 7/2020 | Yantchev et al. |

OTHER PUBLICATIONS

Zhou et al., "Spatial selective manipulation of microbubbles by tunable surface acoustic waves", Biomicrofluidics 10, 034121 (2016) (Year: 2016).*

(56) References Cited

OTHER PUBLICATIONS

Lin et al., "A novel weighted method for layered SAW filters using slanted finger interdigital transducers", J. Phys. D: Appl. Phys. 39 (2006) pp. 466-470 (Year: 2006).*
Wu et al., "Frequency band-gap measurement of two-dimensional air/silicon phononic crystals using layered slanted finger interdigital transducers", J. Appl. Phys. 97, 094916, 2005 (Year: 2005).*
Banerjee et al., "Computational Nondestructive Evaluation Handbook: Ultrasound Modeling Techniques", CRC Press: Boca Raton, FL, USA, 2020 (Year: 2020).*
Bai et al. "The Simulation of Resonant Mode and Effective Electromechanical Coupling Coefficient of Lithium Niobate Crystal with Different Orientations", J. Phys.: Conf. Ser. 1637 012064, 2020 (Year: 2020).*
T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.
M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Y. Yang, A. Gao et al. "5 GHz Lithium Niobate MEMS Resonators With High FOM of 153", 2017 IEEE 30th International Conference in Micro Electro Mechanical Systems (MEMS). Jan. 22-26, 2017. pp. 942-945.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
G. Manohar, "Investigation of Various Surface Acoustic Wave Design Configurations for Improved Sensitivity." Doctoral dissertation, University of South Florida, USA, Jan. 2012, 7 pages.
Ekeom, D. & Dubus, Bertrand & Volatier, A.. (2006). Solidly mounted resonator (SMR) FEM-BEM simulation. 1474-1477. 10.1109/ULTSYM.2006.371.
Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.
Naumenko et al., "Optimal orientations of Lithium Niobate for resonator SAW filters", 2003 IEEE Ultrasonics Symposium—pp. 2110-2113. (Year: 2003).
Buchanan "Ceramit Materials for Electronics" 3rd Edition, first published in 2004 by Marcel Dekker, Inc. pp. 496 (Year 2004). Jan. 2004.
Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 2015.
Material Properties of Tibtech Innovations, © 2018 Tibtech Innovations (Year 2018) Jan. 2018.
Zou, Jie "High-Performance Aluminum Nitride Lamb Wave Resonators for RF Front-End Technology" University of California, Berkeley, Summer 2015, pp. 63 (Year 2015) Jan. 2015.
Santosh, G. , Surface acoustic wave devices on silicon using patterned and thin film ZnO, Ph.D. thesis, Feb. 2016, Indian Institute of technology Guwahati, Assam, India Feb. 2016.

Merriam Webster, dictionary meaning of the word "diaphragm", since 1828, Merriam Webster (Year: 1828) 1828.
Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.
USPTO/ISA, International Search Report and Written Opinion for PCT Application No. PCT/US2020/45654 dated Oct. 29, 2020. 2020.
Safari et al. "Piezoelectric for Transducer Applications" published by Elsevier Science Ltd., pp. 4 (Year: 2000). 2020.
Moussa et al. Review on Triggered Liposomal Drug Delivery with a Focus on Ultrasound 2015, Bentham Science Publishers, pp. 16 (Year 2005) 2005.
Acoustic Properties of Solids ONDA Corporation 592 Weddell Drive, Sunnyvale, CA 94089, Apr. 11, 2003, pp. 5 (Year 2003). 2003.
Bahreynl, B. Fabrication and Design of Resonant Microdevices Andrew William, Inc. 2018, NY (Year 2008). 2008.
T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8 2017.
R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190. 2014.
M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages. 2018.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2. 2018.
Y. Yang, A. Gao et al. "5 GHz Lithium Niobate MEMS Resonators With High FOM of 153", 2017 IEEE 30th International Conference in Micro Electro Mechanical Systems (MEMS). Jan. 22-26, 2017. pp. 942-945 2017.
USPTO/ISA, International Search Report and Written Opinion for PCT Application No. PCT/US2019/036433 dated Aug. 29, 2019. 2019.
USPTO/ISA, International Search Report and Written Opinion for PCT Application No. PCT/US2019/058632 dated Jan. 17, 2020. 2020.
Naumenko et al., "Optimal orientations of Lithium Niobate for resonator SAW filters", 2003 IEEE Ultrasonics Symposium—pp. 2110-2113. (Year: 2003) 2003.
Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.
Rodriguez-Madrid et al., "Super-High-Frequency SAW Resonators on AIN/Diamond", IEEE Electron Device Letters, vol. 33, No. 4, Apr. 2012, pp. 495-497. Year: 2012) 2012.
A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

* cited by examiner

ROTATION IN XY PLANE TO SUPPRESS SPURIOUS MODES IN XBAR DEVICES

RELATED APPLICATION INFORMATION

This patent claims priority from provisional patent application 62/896,821, filed Sep. 6, 2019, entitled ROTATION IN XY PLANE TO SUPPRESS SPURIOUS MODES IN XBAR DEVICES, the entire content of which is incorporated herein by reference.

This patent is also a continuation in part of application Ser. No. 16/689,707, entitled BANDPASS FILTER WITH FREQUENCY SEPARATION BETWEEN SHUNT AND SERIES RESONATORS SET BY DIELECTRIC LAYER THICKNESS, filed Nov. 20, 2019, which claims priority from application Ser. No. 16/230,443, entitled TRANSVERSELY-EXCITED FILM BULK ACOUSTIC RESONATOR, filed Dec. 21, 2018, now U.S. Pat. No. 10,491,192, issued Nov. 26, 2019, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR, and application 62/753,815, filed Oct. 31, 2018, entitled LITHIUM TANTALATE SHEAR-MODE FILM BULK ACOUSTIC RESONATOR.

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ Long Term Evolution) specification defines frequency bands from 3.3 GHz to 5.9 GHz. Some of these bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave BAW) resonators, film bulk acoustic wave resonators (FBAR), and other types of acoustic resonators. However, these existing technologies are not well-suited for use at the higher frequencies proposed for future communications networks.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DESCRIPTION

Description of Apparatus

Figure 1:
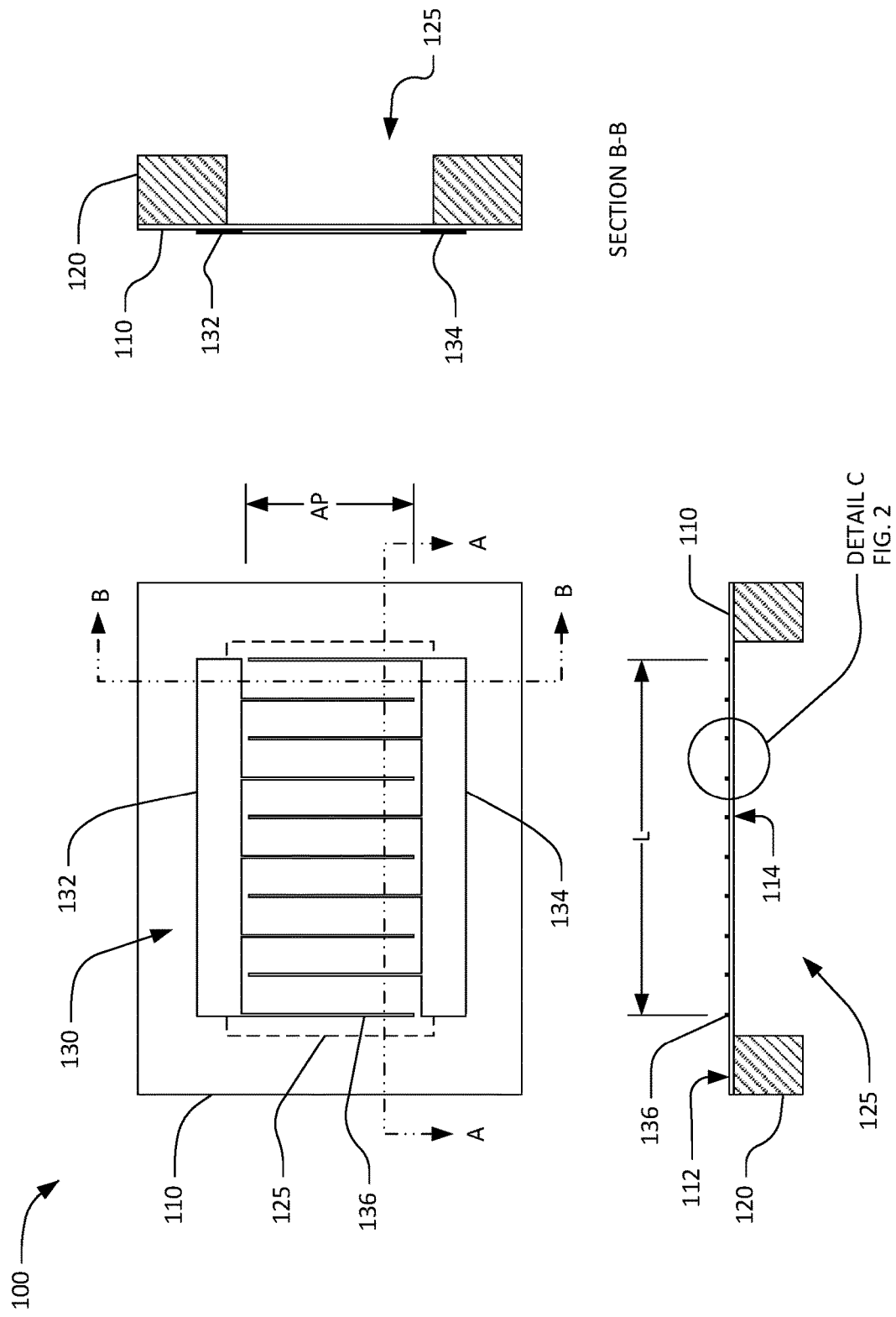
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. As will be discussed later in further detail, the piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The piezoelectric plate 110 may be bonded to the substrate 120 using a wafer bonding process, or grown on the substrate 120, or attached to the substrate in some other manner. The piezoelectric plate may be attached directly to the substrate, or may be attached to the substrate via one or more intermediate material layers.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites an acoustic wave within the piezoelectric plate 110. As will be discussed in further detail, the excited acoustic wave is a bulk shear wave that propagates in the direction normal to the surface of the piezoelectric plate 110, which is also normal, or transverse, to the direction of the electric field created by the IDT fingers. Thus, the XBAR is considered a transversely-excited film bulk wave resonator.

A cavity 125 is formed in the substrate 120 such that the portion of the piezoelectric plate 110 containing the IDT 130 is suspended over the cavity 125 without contacting the substrate 120. "Cavity" has its conventional meaning of "an empty space within a solid body." The cavity 125 may be a hole completely through the substrate 120 (as shown in Section A-A and Section B-B) or a recess in the substrate 120. The cavity 125 may be formed, for example, by selective etching of the substrate 120 before or after the piezoelectric plate 110 and the substrate 120 are attached. As shown in FIG. 1, the cavity 125 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
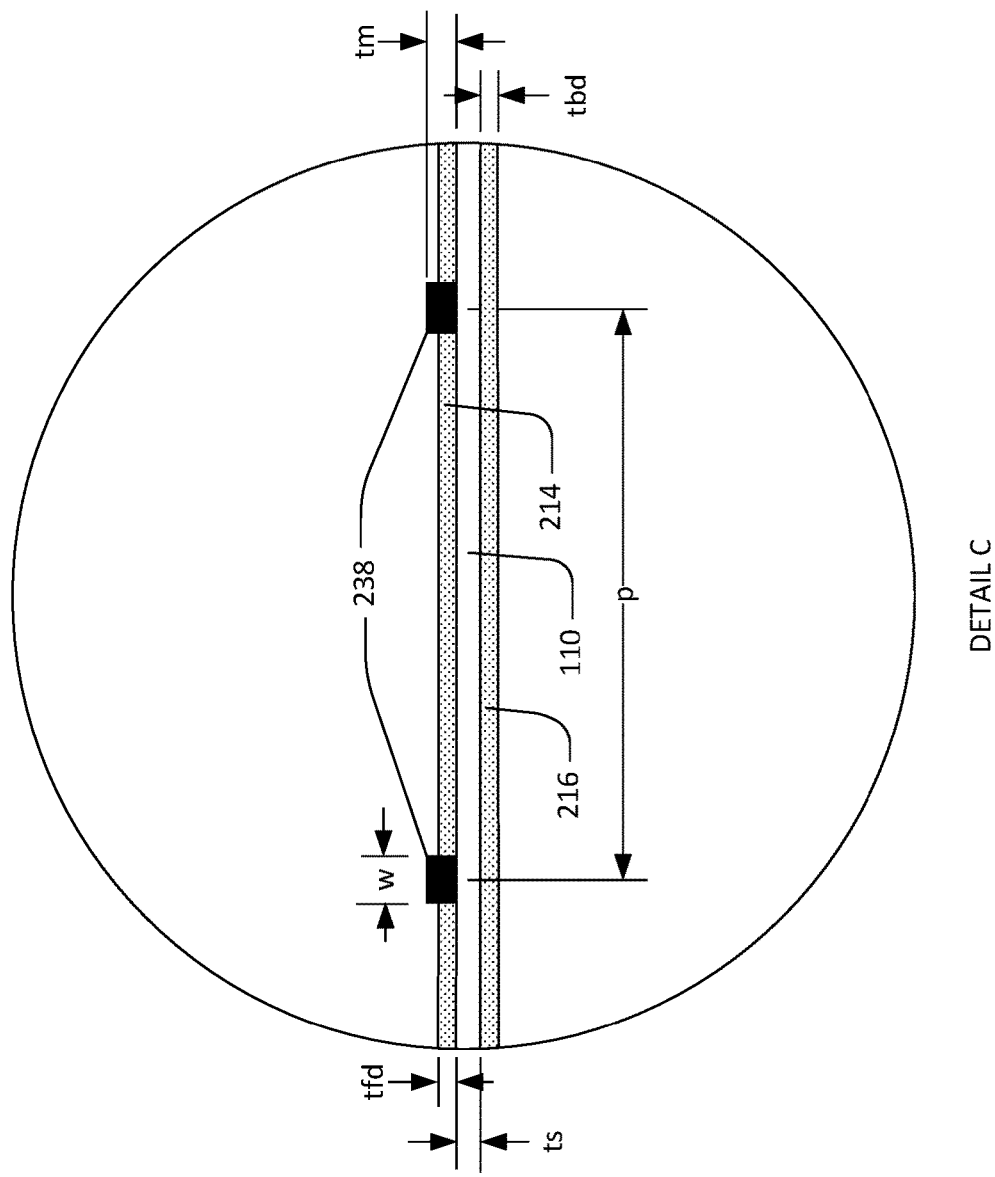
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be aluminum or a substantially aluminum alloy, copper or a substantially copper alloy, molybdenum, beryllium, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3:
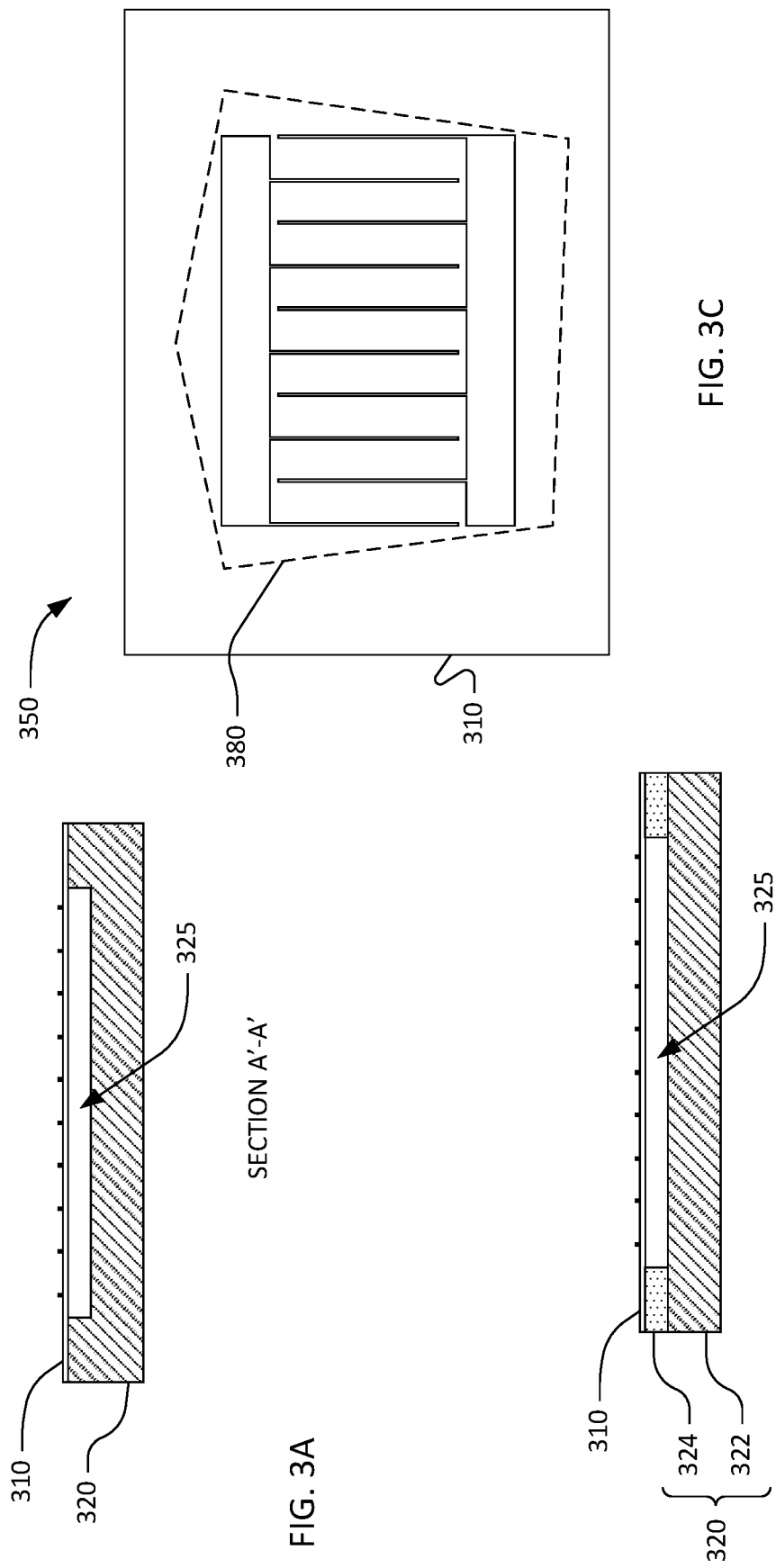
FIG. 3A is an alternative schematic cross-sectional view of the XBAR of FIG. 1.
FIG. 3B is another alternative schematic cross-sectional view of the XBAR of FIG. 1.
FIG. 3C is an alternative schematic plan view of an XBAR.

FIG. 3A and FIG. 3B show two alternative cross-sectional views along the section plane A-A defined in FIG. 1. In FIG. 3A, a piezoelectric plate 310 is attached to a substrate 320. A cavity 325, which does not fully penetrate the substrate 320, is formed in the substrate under the portion of the piezoelectric plate 310 containing the IDT of an XBAR. The cavity 325 may be formed, for example, by etching the substrate 320 before attaching the piezoelectric plate 310. Alternatively, the cavity 325 may be formed by etching the substrate 320 with a selective etchant that reaches the substrate through one or more openings provided in the piezoelectric plate 310.

In FIG. 3B, the substrate 320 includes a base 322 and an intermediate layer 324 disposed between the piezoelectric plate 310 and the base 322. For example, the base 322 may be silicon and the intermediate layer 324 may be silicon dioxide or silicon nitride or some other material. A cavity 325 is formed in the intermediate layer 324 under the portion of the piezoelectric plate 310 containing the IDT of an XBAR. The cavity 325 may be formed, for example, by etching the intermediate layer 324 before attaching the piezoelectric plate 310. Alternatively, the cavity 325 may be formed by etching the intermediate layer 324 with a selective etchant that reaches the substrate through one or more openings provided in the piezoelectric plate 310.

FIG. 3C is a schematic plan view of another XBAR 350. The XBAR 350 includes an IDT formed on a piezoelectric plate 310. The piezoelectric plate 310 is disposed over a cavity 380 in a substrate. In this example, the cavity 380 has an irregular polygon shape such that none of the edges of the cavity are parallel, nor are they parallel to the conductors of the IDT. A cavity may have a different shape with straight or curved edges.

Figure 4:
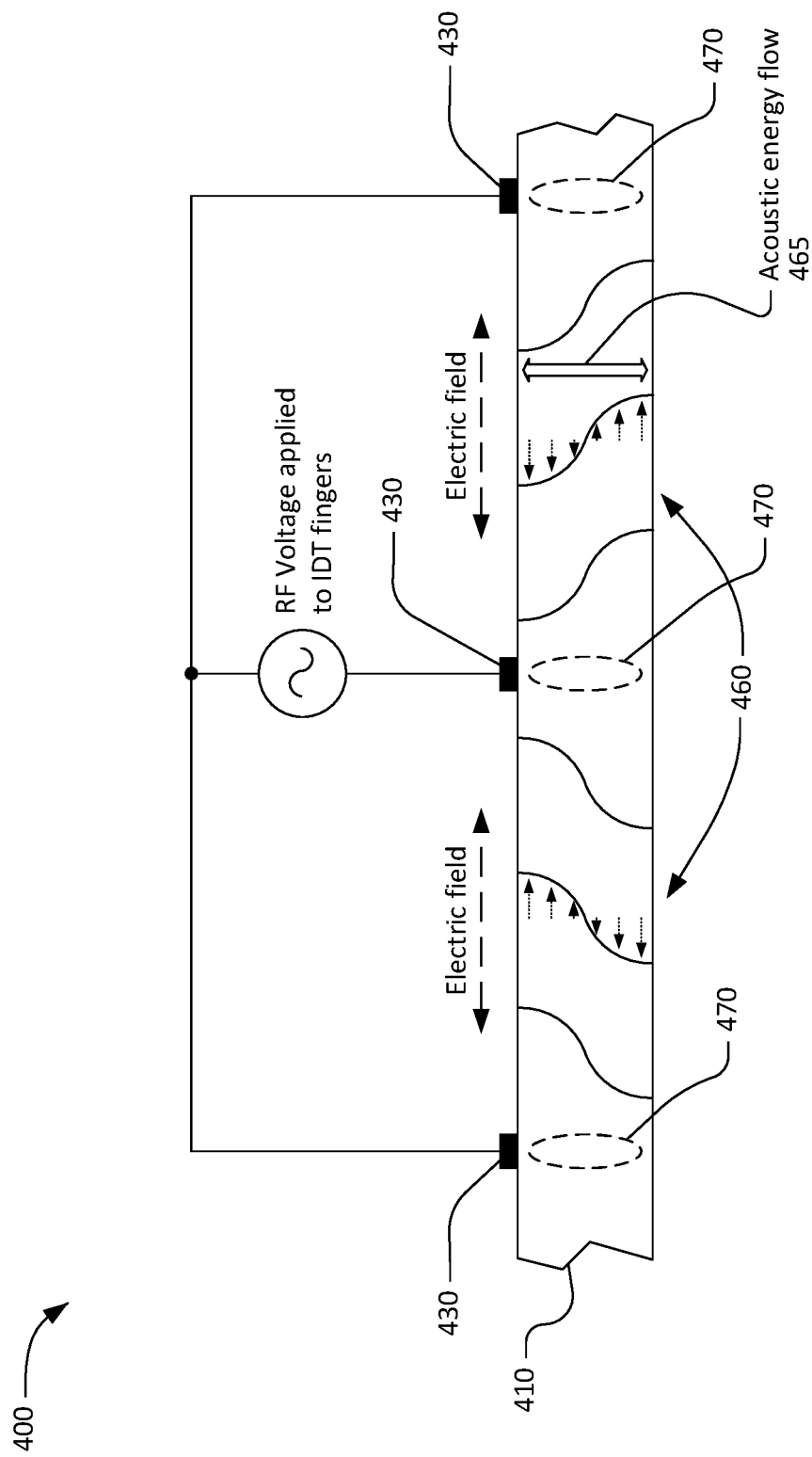
FIG. 4 is a graphic illustrating a shear horizontal acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. An RF voltage is applied to the interleaved fingers 430. This voltage creates a time-varying electric field between the fingers. The direction of the electric field is lateral, or parallel to the surface of the piezoelectric plate 410, as indicated by the arrows labeled "electric field". Due to the high dielectric constant of the piezoelectric plate, the electric field is highly concentrated in the plate relative to the air. The lateral electric field introduces shear deformation, and thus strongly excites shear-mode acoustic waves, in the piezoelectric plate 410. In this context, "shear deformation" is defined as deformation in which parallel planes in a material remain parallel and maintain a constant distance while translating relative to each other. "Shear acoustic waves" are defined as acoustic waves in a medium that result in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited shear acoustic waves is substantially vertical, normal to the surface of the piezoelectric plate, as indicated by the arrow 465.

Considering FIG. 4, there is little electric field strength immediately under the IDT fingers 430, and thus acoustic modes are only minimally excited in the regions 470 under the fingers. There may be evanescent acoustic motions in these regions. An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. Thus, high piezoelectric coupling enables the design and implementation of microwave and millimeter-wave filters with appreciable bandwidth.

Figure 5:
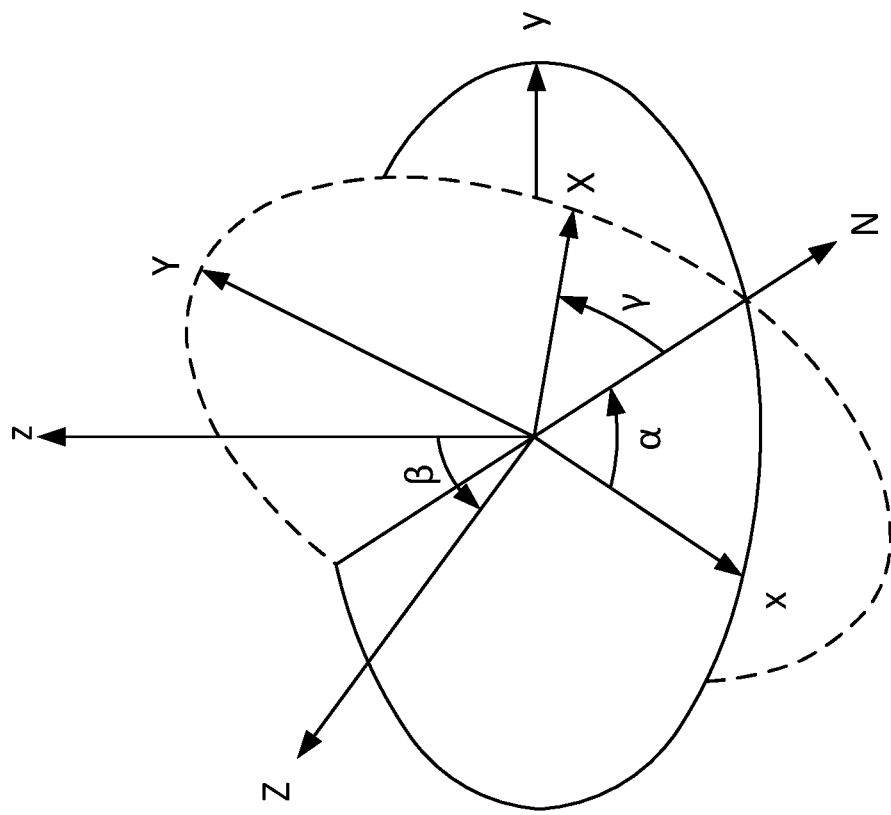
FIG. 5 is a graphical representation of Euler angles.

FIG. 5 is a graphical illustration of Euler angles. Euler angles are a system, introduced by Swiss mathematician Leonhard Euler, to define the orientation of a body with respect to a fixed coordinate system. The orientation is defined by three successive rotations about angles α, β, and γ.

As applied to acoustic wave devices, XYZ is a three-dimensional coordinate system aligned with the crystalline axes of the piezoelectric material. xyz is a three-dimensional coordinate system aligned with the acoustic wave device, where the z axis is normal to the surface of the piezoelectric material and xy is the plane of the surface of the piezoelectric material. The vector N is the intersection of the xy and XY planes. The vector N is also the common perpendicular to the z and Z axis.

Although application Ser. No. 16/230,443 is not limited to a specific type or orientation of a piezoelectric material, all of the examples in those applications use Lithium Tantalate or Lithium Niobate piezoelectric plates with the Z crystalline axis normal to the plate surface and the Y crystalline axis orthogonal to the IDT fingers. Such piezoelectric plates have Euler angles of 0°, 0°, 90°. Related application Ser. No. 16/518,594 describes XBAR devices on piezoelectric plates with Euler angles 0°, β, 90°, where −15°≤β<0°. Such XBAR devices also have higher piezoelectric coupling than devices on piezoelectric plates with Euler angles of 0°, 0°, 90°. Related application Ser. No. 16/782,971 describes XBAR devices on piezoelectric plates with Euler angles 0°, β, 0°, where 0°≤β<60°. Such XBAR devices have higher piezoelectric coupling than devices on piezoelectric plates with Euler angles of 0°, 0°, 90°. In all of these XBAR configurations, one or both of crystalline X and Y axes lie in the plane of the surface, and the finger of the IDT are perpendicular to either the X or Y crystalline axis.

The IDT of an XBAR may excite other undesired, or spurious, acoustic modes that may include, but are not limited to, harmonics and higher orders of the primary acoustic mode, plate modes that propagate orthogonal to the IDT fingers, and transverse modes that propagate parallel to the IDT fingers. These spurious acoustic modes may cause undesired perturbations or spurs in the admittance characteristics of an XBAR.

The dominant parameter that determines the resonance and anti-resonance frequencies of the primary mode of an XBAR is the thickness of the piezoelectric membrane. The resonance and anti-resonance frequencies also depend, to a lesser extent, on the pitch and width, or mark, of the IDT fingers. The resonance and anti-resonance frequencies are almost totally independent of the rotation of the XBAR device in the X-Y plane. However, many of the propagating spurious modes are sensitive to this angle of rotation. Thus, rotation in the X-Y plane provides a method to suppress at least some spurious modes without materially effecting the primary acoustic mode of the XBAR.

Figure 6:
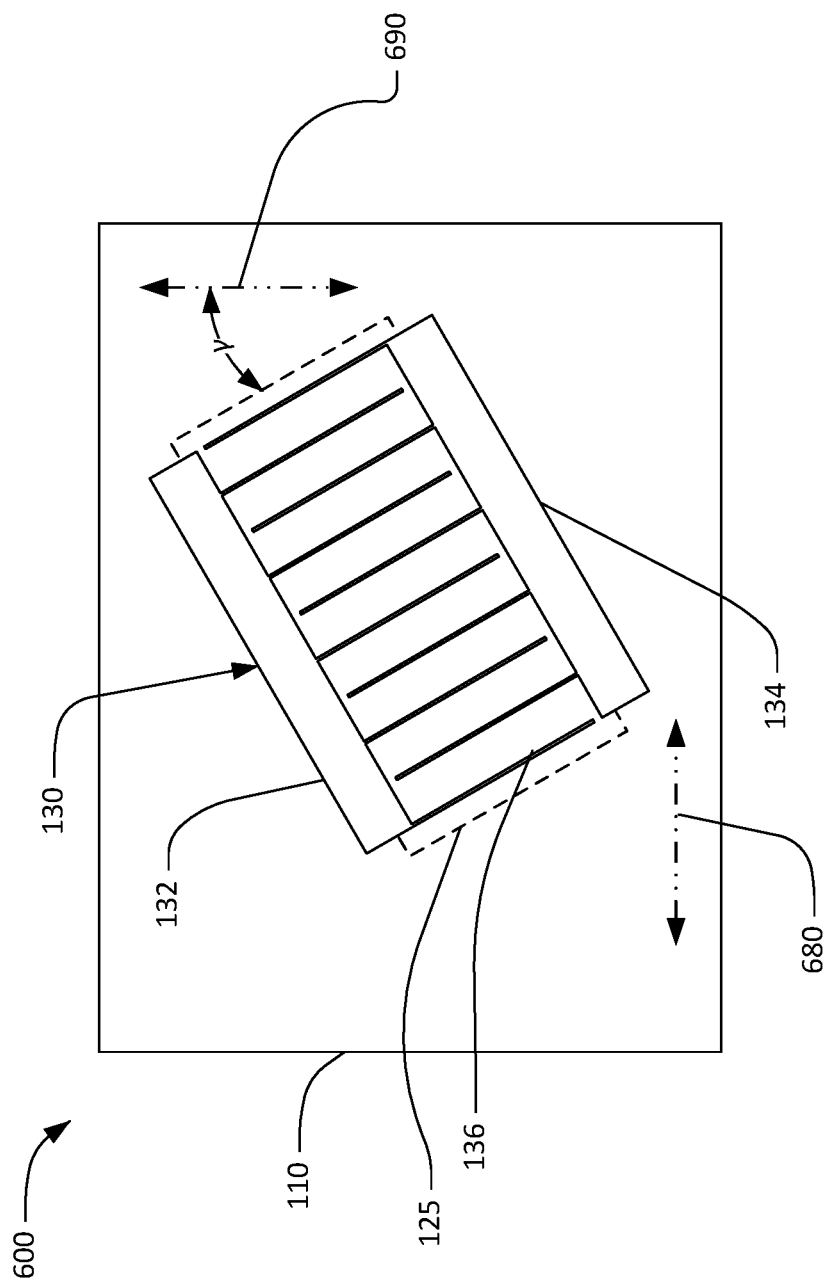
FIG. 6 is a schematic plan view of the XBAR of FIG. 1 showing an X-axis and a Y-axis of a piezoelectric plate.

FIG. 6 shows a schematic plan view of an XBAR using a Z-cut piezoelectric plate where the X-axis 680 and the Y-axis 690 of the piezoelectric plate 110 are indicated. As can be seen in FIG. 6, the IDT 130 is rotated with respect to the X-axis 680 and the Y-axis 690 such that the fingers 136 of the IDT 130 extend in an oblique direction that is neither parallel nor orthogonal to the X-axis 680 or the Y-axis 690. In an example, the fingers 136 of the IDT 130 could be at an angle gamma γ in a range from 60 degrees to 120 degrees to the Y-axis. The angle can be selected so as to maximally suppress problematic spurs. In another example, the fingers 136 could be at other angles to the X-axis, Y-axis, or the Z-axis.

Figure 7:
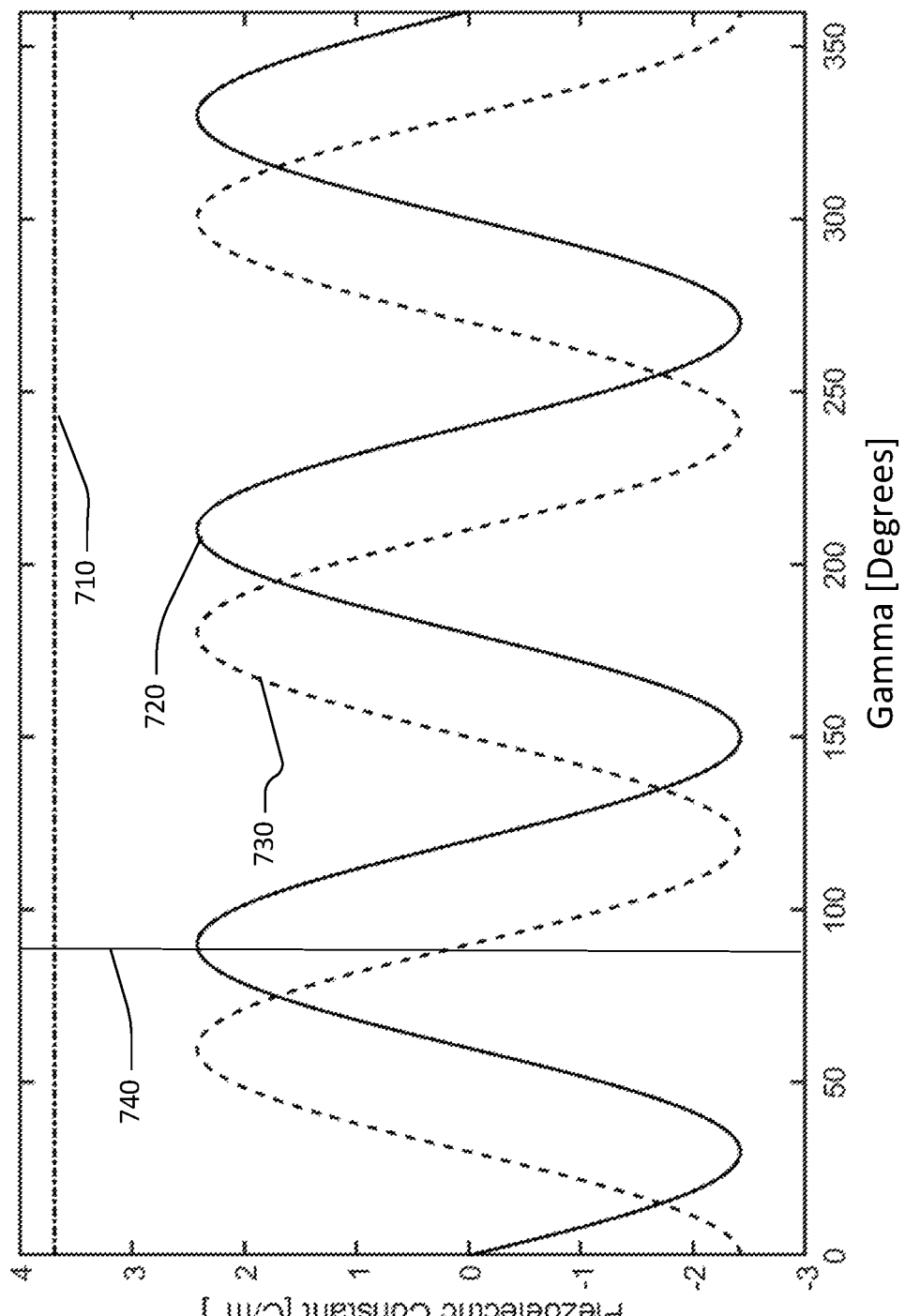
FIG. 7 is a chart of piezoelectric constants as a function of interdigital transducer angle for Z-cut LiNbO3.

FIG. 7 is a chart 700 of piezoelectric constants of Z-cut LiNbO3 as a function of degrees of the angle gamma. The piezo electric constants (represented by the matrix $e_{ij}$) determine how strongly the electric field couples to the displacements of various acoustic modes. The dot-dash curve 710 is piezoelectric coefficient e15, which is independent of the angle gamma. e15 and determines the coupling to the primary XBAR mode. The solid curve 720 is e11, which determines coupling to propagating S0 modes. The dashed curve 730 is e12, which determines coupling to propagating SH0 modes. Vertical line 740 at 90 degrees indicates the nominal XBAR, as described in U.S. Pat. No. 10,491,192. Because of the crystal symmetry (120 degrees rotation) and the fact that the sign of the piezoelectric coefficient is not relevant here to determining mode coupling, only angles from 60 to 120 degrees need to be considered.

Figure 8A:
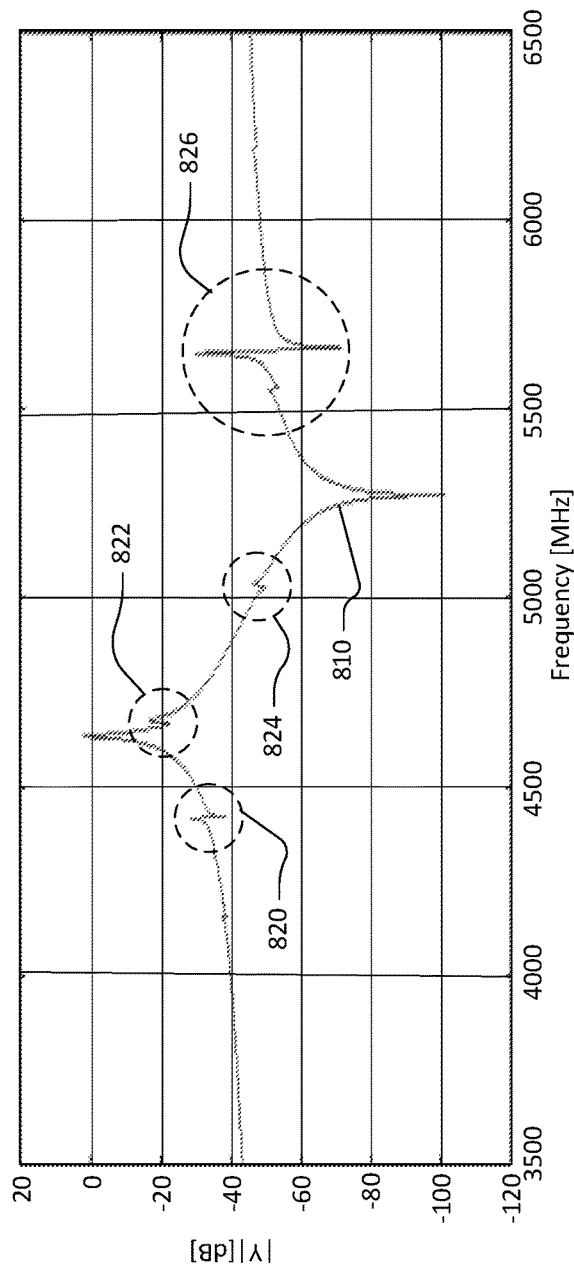
FIG. 8A is a graph of the magnitude of admittance versus frequency for an XBAR where fingers of an interdigital transducer extend in a direction parallel to an X-axis of a piezoelectric plate.

FIG. 8A is a chart 800 with a curve 810 plotting the magnitude of the admittance of an exemplary XBAR as a function of frequency where fingers of the IDT extend in a direction parallel to the X-axis of a piezoelectric plate (i.e., gamma=90). The curve 810 exhibits a resonance (where the admittance is highest) at a frequency about 4700 MHz and an anti-resonance (where the admittance is lowest) at a frequency about 5300 MHz. Spurious modes 820, 822, 824, and 826 are evident in the admittance curve. Such spurious modes can result in undesired effects such as increased insertion loss and transmission ripple in the passband of a filter.

Figure 8B:
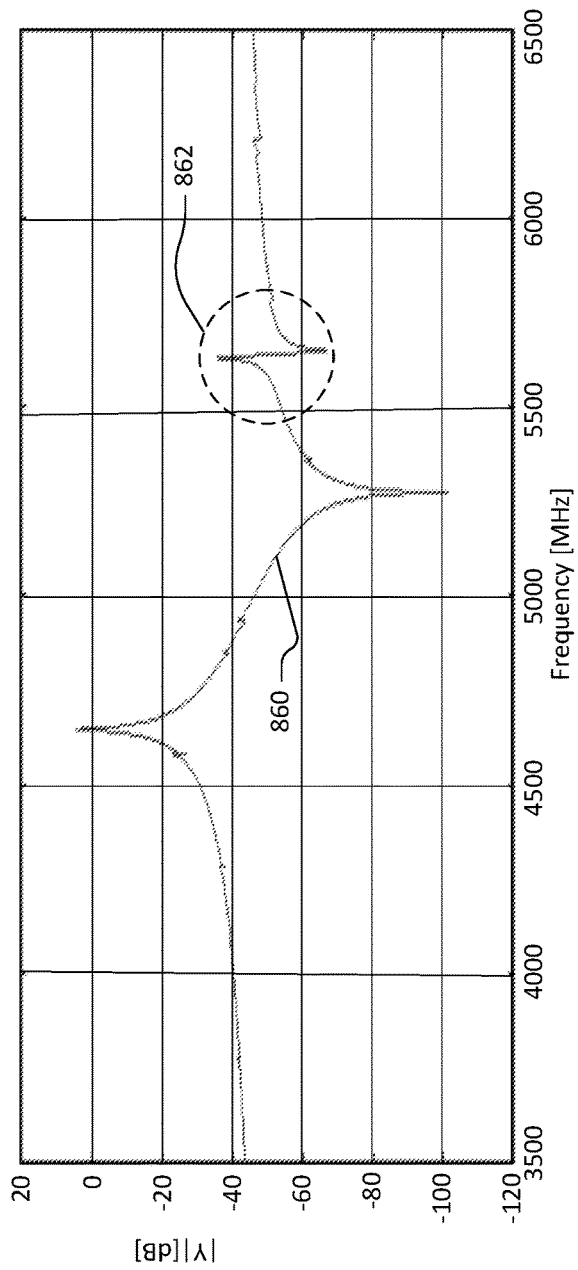
FIG. 8B is a graph of the magnitude of admittance versus frequency for an XBAR where fingers of an interdigital transducer are at an angle theta of 25 degrees with respect to an X-axis of a piezoelectric plate.

FIG. 8B is a chart 850 with a curve 860 plotting the magnitude of the admittance of an exemplary XBAR as a function of frequency where the fingers of the IDT are rotated to an angle gamma of 65 degrees with respect to an X-axis of a piezoelectric plate.

Figure 9A:
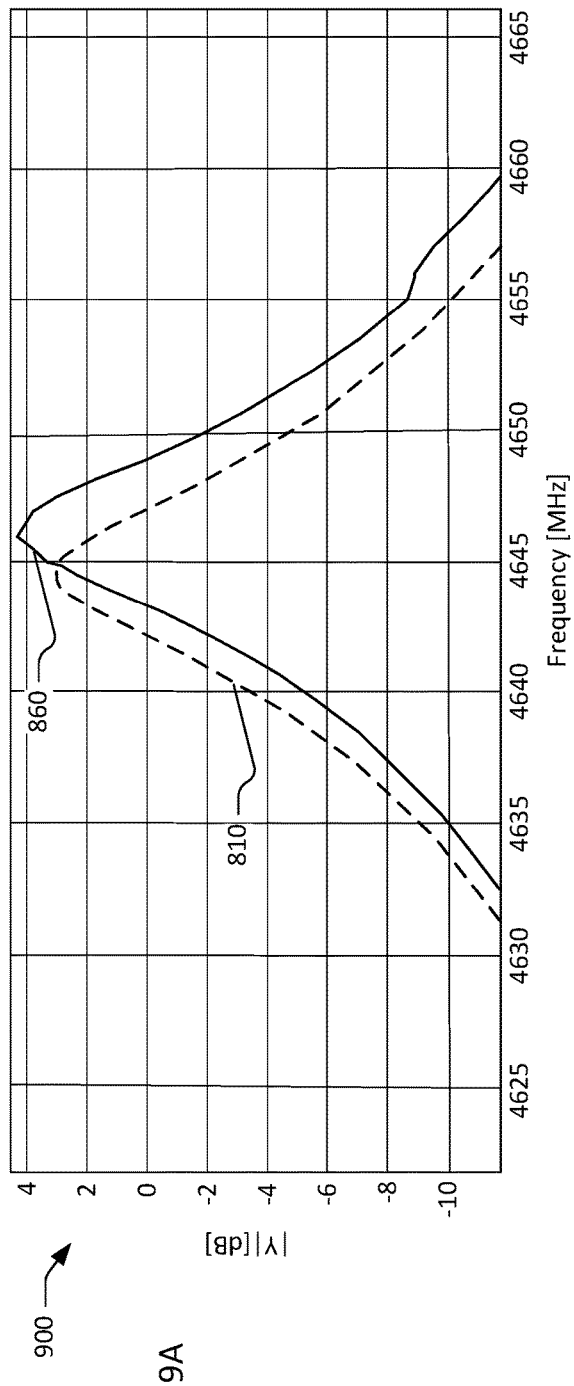
FIG. 9A is an enlarged view the resonance frequencies of FIG. 8A and FIG. 8B overlaid.
Figure 9B:
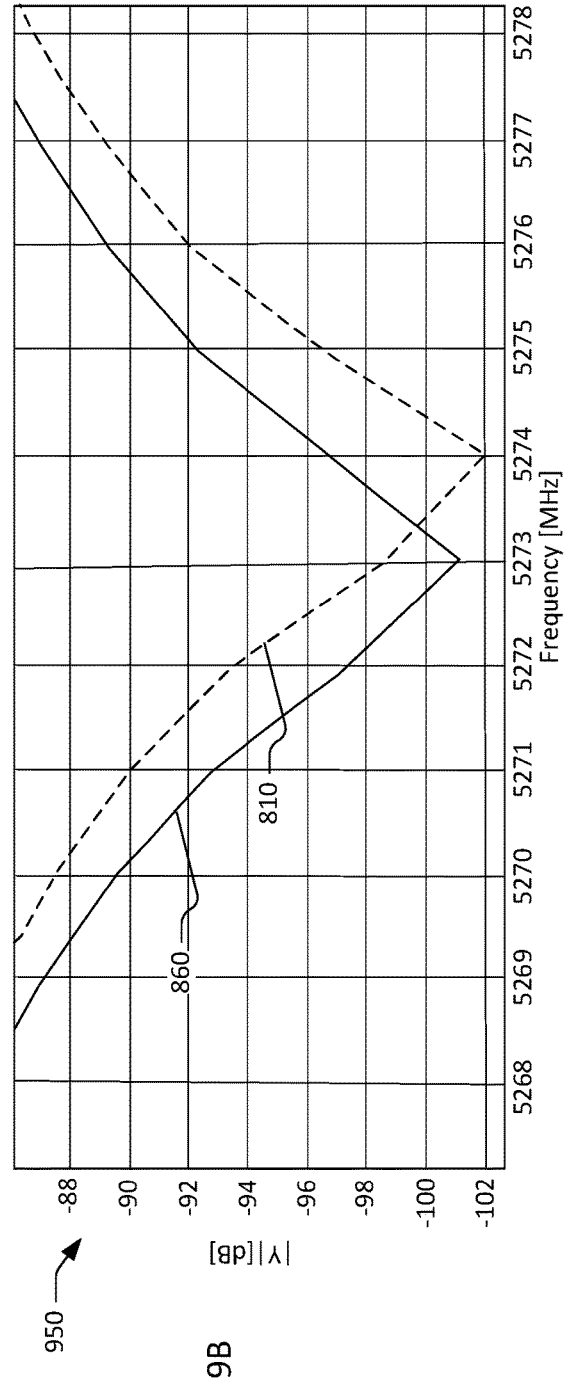
FIG. 9B is an enlarged view the anti-resonance frequencies of FIG. 8A and FIG. 8B overlaid.

FIG. 9A is a chart 900 with an enlarged view the resonance frequencies of FIG. 8A and FIG. 8B overlaid. FIG. 9B is a chart 950 with an enlarged view the anti-resonance frequencies of FIG. 9A and FIG. 9B overlaid.

Both the XBAR of FIG. 8A and the XBAR of FIG. 8B have piezoelectric plates formed of ZX-cut lithium niobate and IDTs formed of aluminum, and p=5 um, mark=650 nm, tm=100 nm, is =400 nm, tfd=0. Comparison of FIGS. 8A and 8B shows that a rotation of 25 degrees in the X-Y plane substantially reduces the spurious modes. The spurious modes 820, 822, 824 seen in FIG. 8A are effectively suppressed and the amplitude of the spurious mode 862 is reduced relative to spurious mode 826. The resonance frequency is only increased by 1 MHz (0.02%) and the anti-resonance frequency is only reduced by 1 MHz (0.02%), as seen in more detail in FIGS. 9A and 9B. Rotation in the XY plane of the lithium niobate piezoelectric with respect to the IDT has only a minimal effect on the primary XBAR mode.

The invention is not limited to a particular rotation. Rather, X-Y rotation provides a degree-of-freedom that a designer can use to suppress spurious modes during the design of an XBAR filter without altering the characteristics of the primary mode. By changing the in-plane rotation angle gamma, S0 modes can be suppressed at the expense of exciting SH0 modes. Since S0 and SH0 modes have different velocities, they will in general lay at distinct frequencies such that one may impact important filter requirements more than another.

Figure 10A:
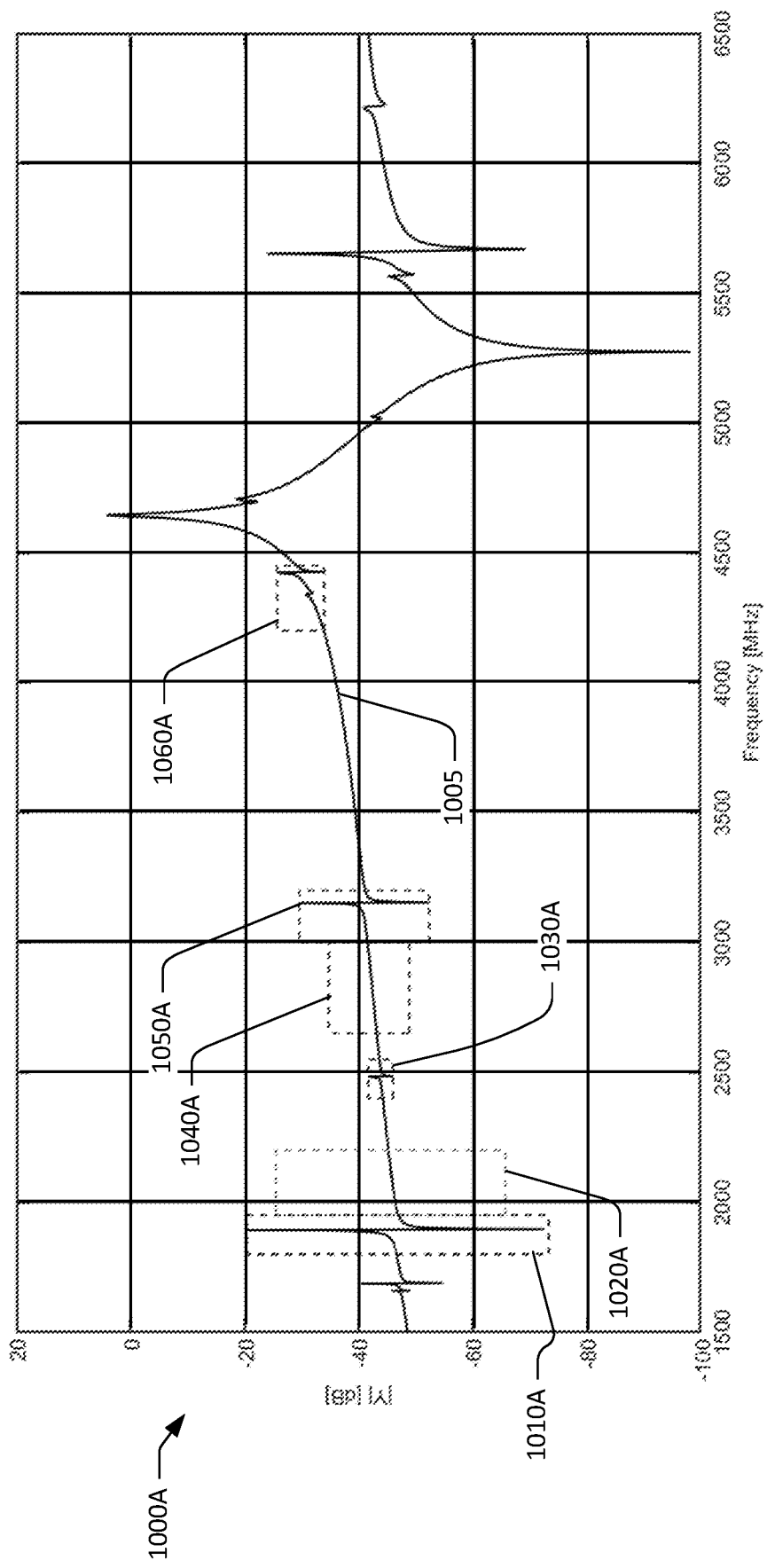
FIG. 10A is a graph of the magnitude of admittance versus frequency for another XBAR where fingers of an interdigital transducer extend at an angle theta of 90 degrees to an X-axis of a piezoelectric plate.

FIG. 10A is a chart 1000A of resonance and anti-resonance frequencies shown in solid line curve 1005 of another exemplary XBAR where fingers of an interdigital transducer extend at an angle gamma of 90 degrees to a Y-axis of a piezoelectric plate. For this XBAR on ZX-cut LN with a gamma=90 degrees, p=5 um, mark=650 nm, tm=100 nm, is =400 nm, and tfd=0. Areas of interest are identified at 1010A, 1020A, 1030A, 1040A, 1050A, and 1060A, including problematic spurs.

Figure 10B:
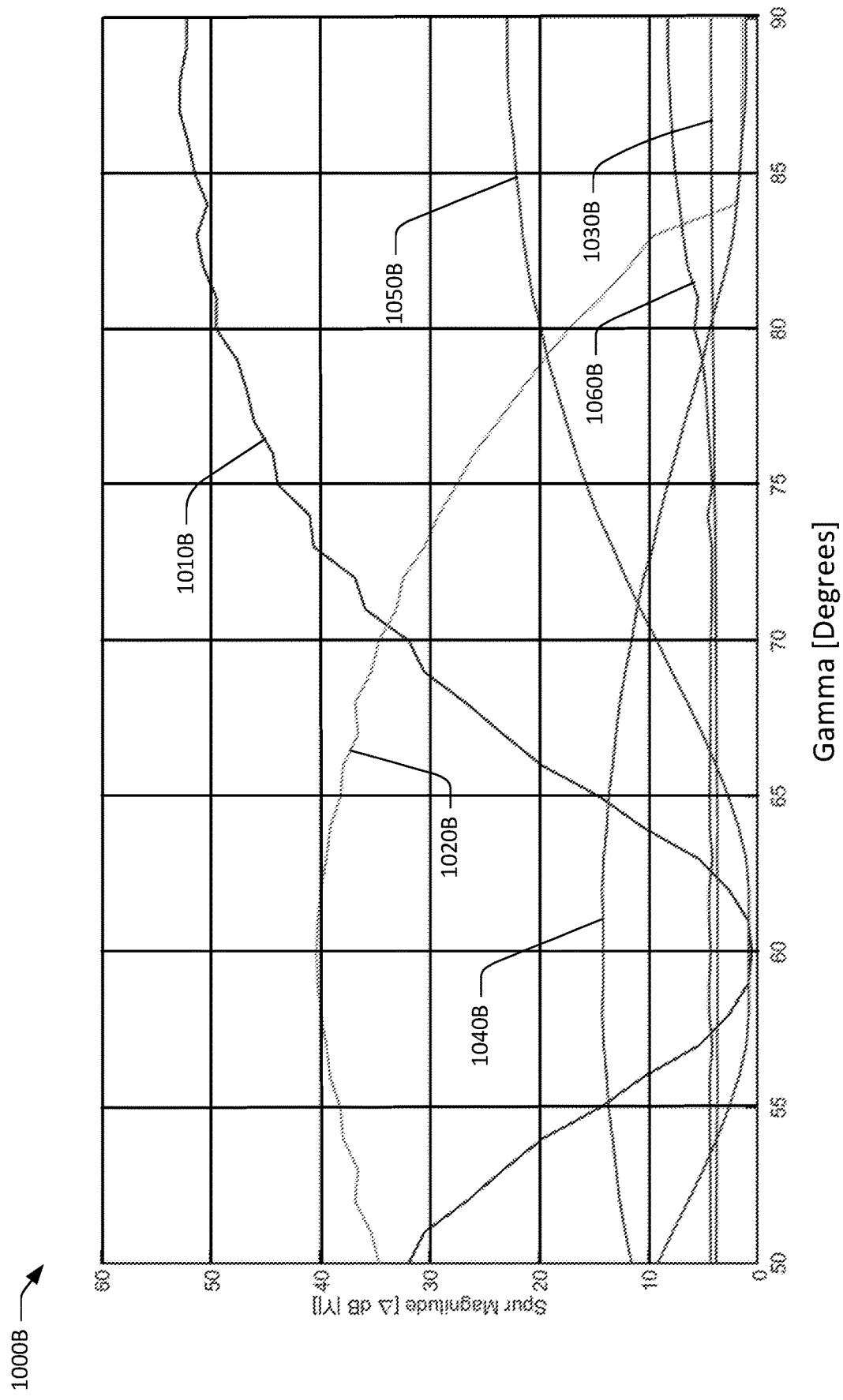
FIG. 10B is a chart of spur magnitude as a function of angle theta for the XBAR of FIG. 10A.

FIG. 10B is a chart of spur magnitude as a function of angle gamma for the XBAR of FIG. 10A. Spur 1010A corresponds to curve 1010B, spur 1020A corresponds to curve 1020B, spur 1030A corresponds to curve 1030B, spur 1040A corresponds to curve 1040B, spur 1050A corresponds to curve 1050B, and spur 1060A corresponds to curve 1060B. In this example, gamma is varied from the original 90 degrees shown in FIG. 10A. When gamma is varied, spurs such as 1010B and 1050B due to S0 plate modes are suppressed at gamma=60 degrees. Other spurs, such as 1020B and 1040B due to SH0 plate modes are excited. Still other spurs, such as 1030B and 1060B, due to A0 plate modes are substantially unaffected by the rotation.

Figure 11A:
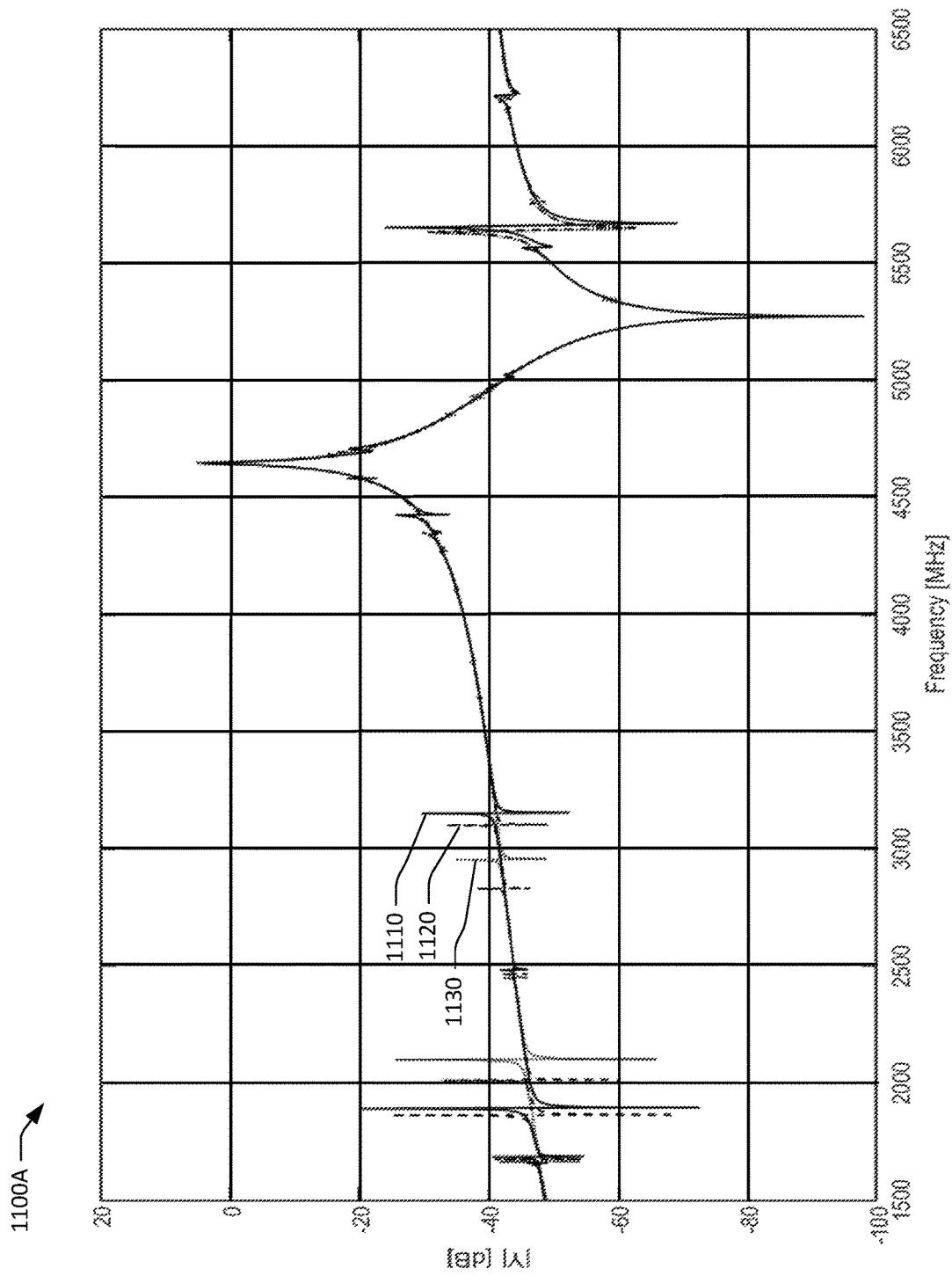
FIG. 11A is a graph of the magnitude of admittance versus frequency for XBARs with various angles theta of rotation to the X-axis of the piezoelectric plate.

FIG. 11A is a chart 1100A of resonance and anti-resonance frequencies of XBARs showing the magnitude of the admittance as a function of frequency for different angles gamma of rotation to the Y-axis of the piezoelectric plate. The piezoelectric plate of FIG. 11A is formed of ZX-cut lithium niobite, has IDTs formed of aluminum, and has p=5 um, mark=650 nm, tm=100 nm, is =400 nm, and tfd=0. The XBAR represented by solid curve 1110 has an angle gamma of 90 degrees. The XBAR represented by dash curve 1120 has an angle gamma of 75 degrees. The XBAR represented by dot curve 1130 has an angle gamma of 60 degrees.

Figure 11B:
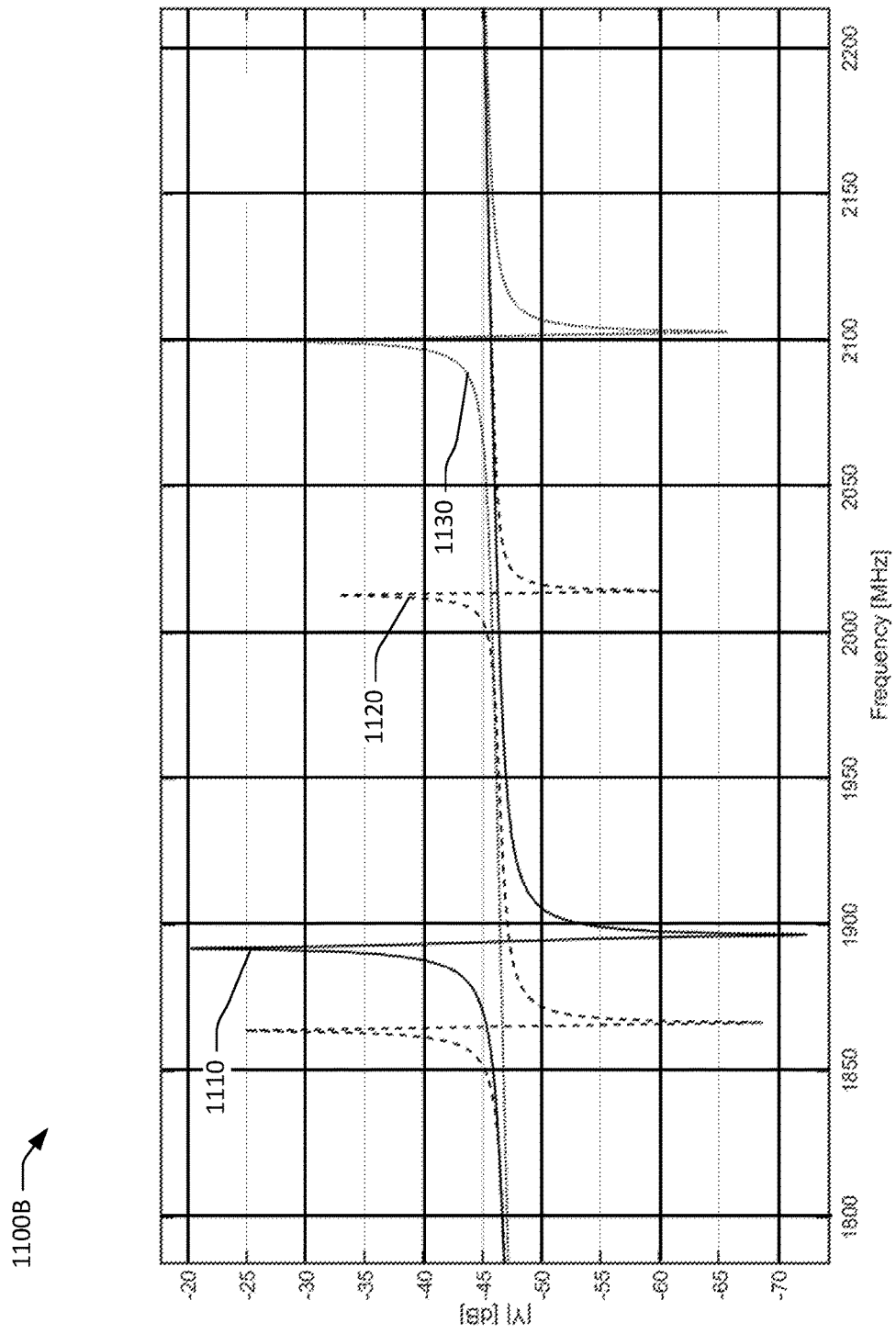
FIG. 11B is an enlarged view of a portion of FIG. 11A around a frequency of 2 GHz.
Figure 11C:
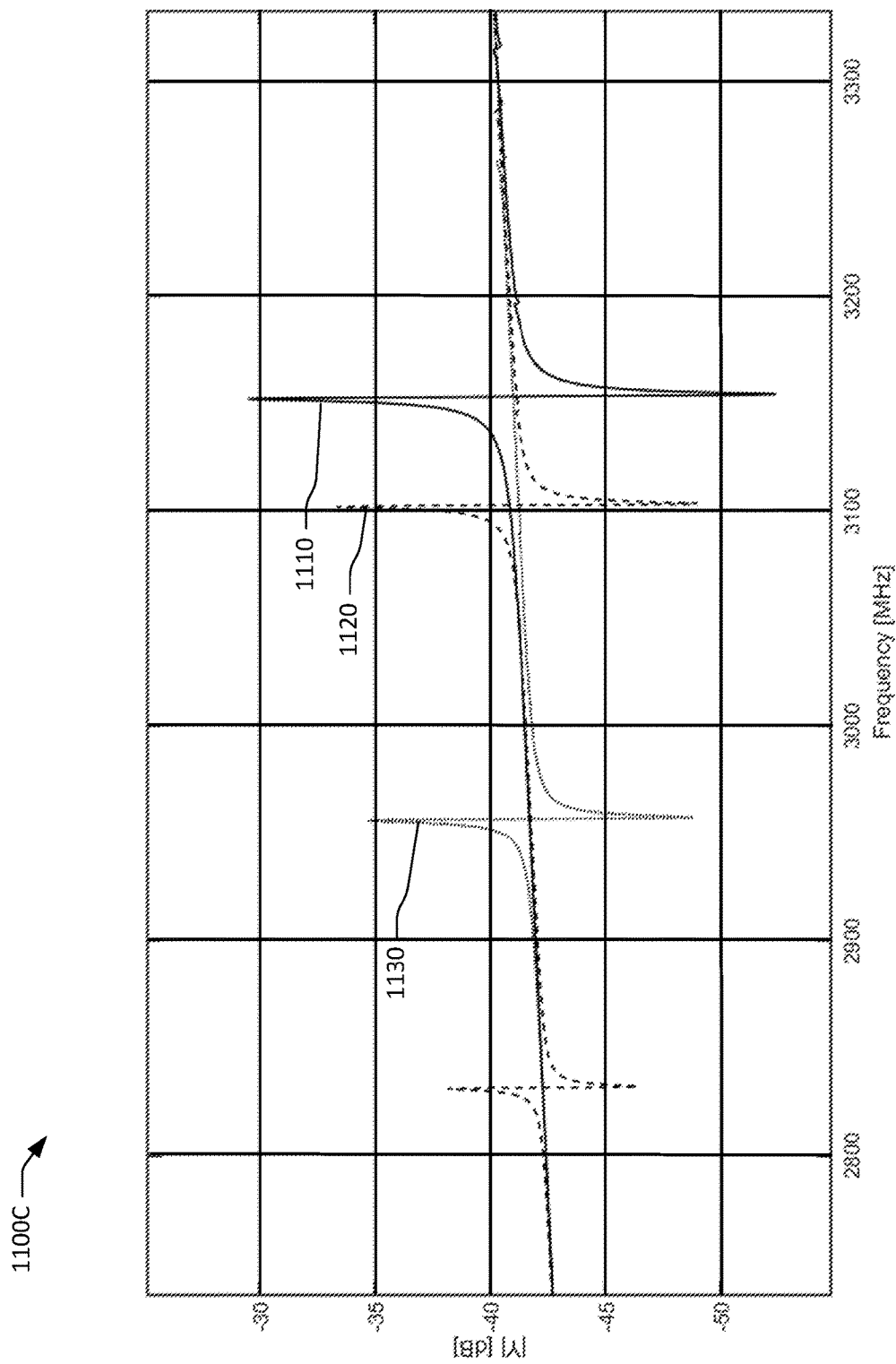
FIG. 11C is an enlarged view of a portion of FIG. 11A around a frequency of 3 GHz.
Figure 11D:
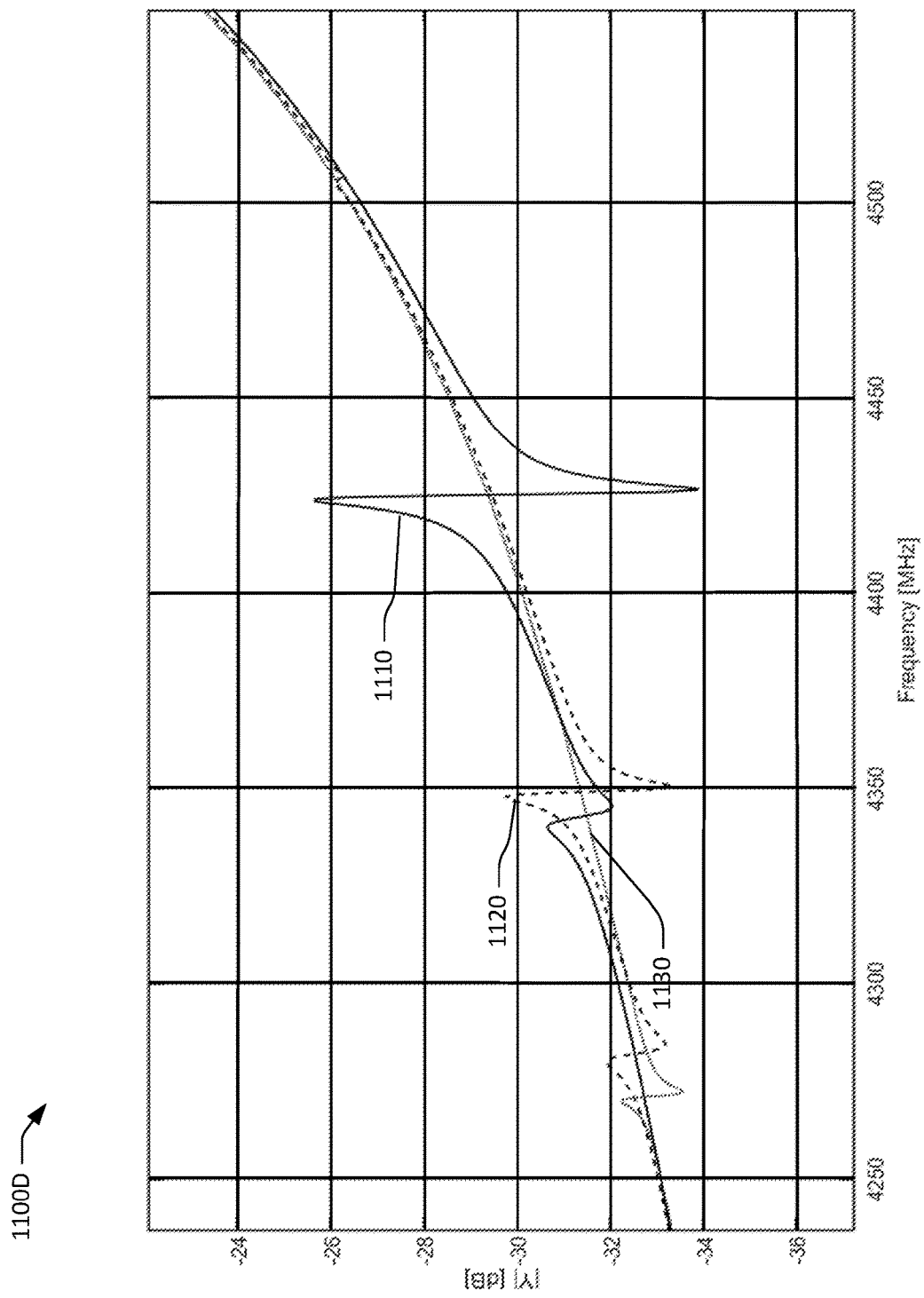
FIG. 11D is an enlarged view of a portion of FIG. 11A around a frequency of 4.4 GHz.
Figure 11E:
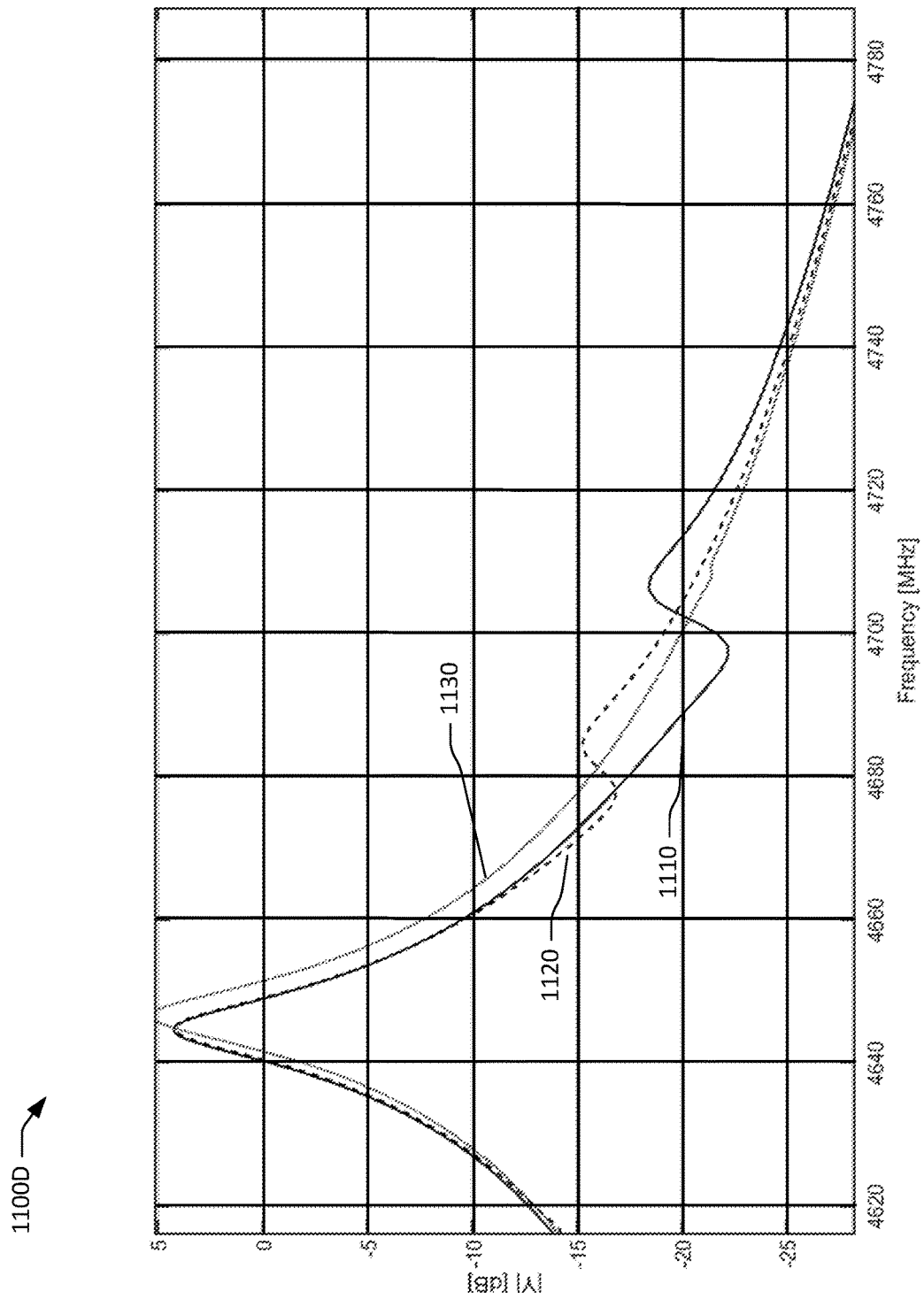
FIG. 11E is an enlarged view of a portion of FIG. 11A around a frequency of 4.7 GHz.

FIG. 11B is a chart 1100B showing an enlarged view of a portion of FIG. 11A around a frequency of 2 GHz. FIG. 11C is a chart 1100C showing an enlarged view of a portion of FIG. 11A around a frequency of 3 GHz. FIG. 11D is a chart 1100D showing an enlarged view of a portion of FIG. 11A around a frequency of 4.4 GHz. FIG. 11E is a chart 1100E showing an enlarged view of a portion of FIG. 11A around a frequency of 4.7 GHz. These charts show that varying the angle gamma can allow a designer to suppress spurs in certain frequency ranges or move spurs to more desirable frequencies where they cause fewer problems.

Figure 11G:
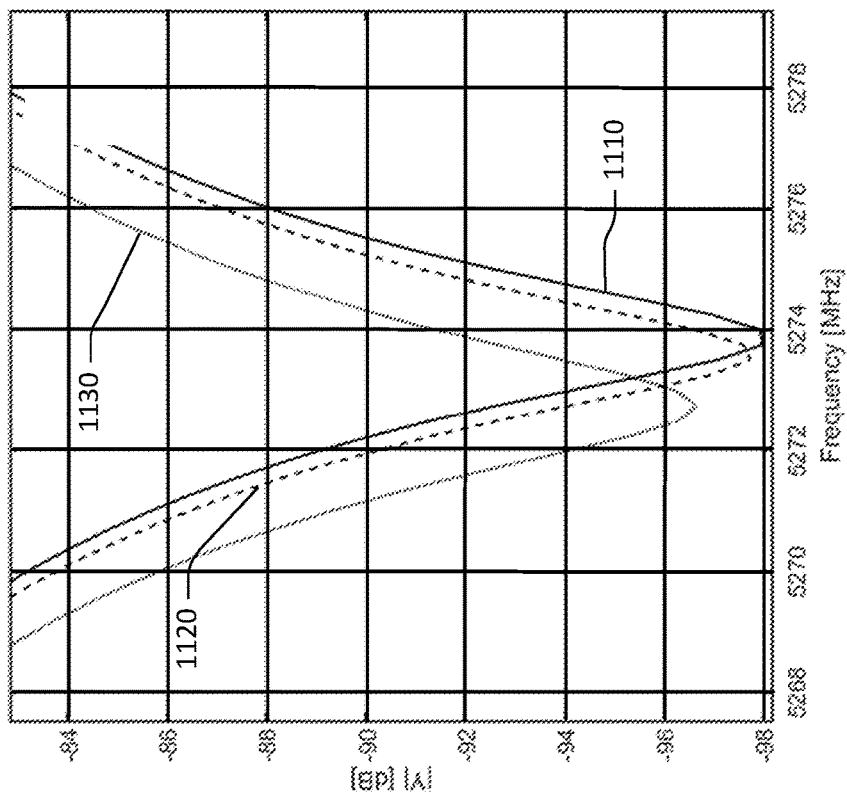
FIG. 11G is an enlarged view of a portion of FIG. 11A around an anti-resonance frequency.
Figure 11F:
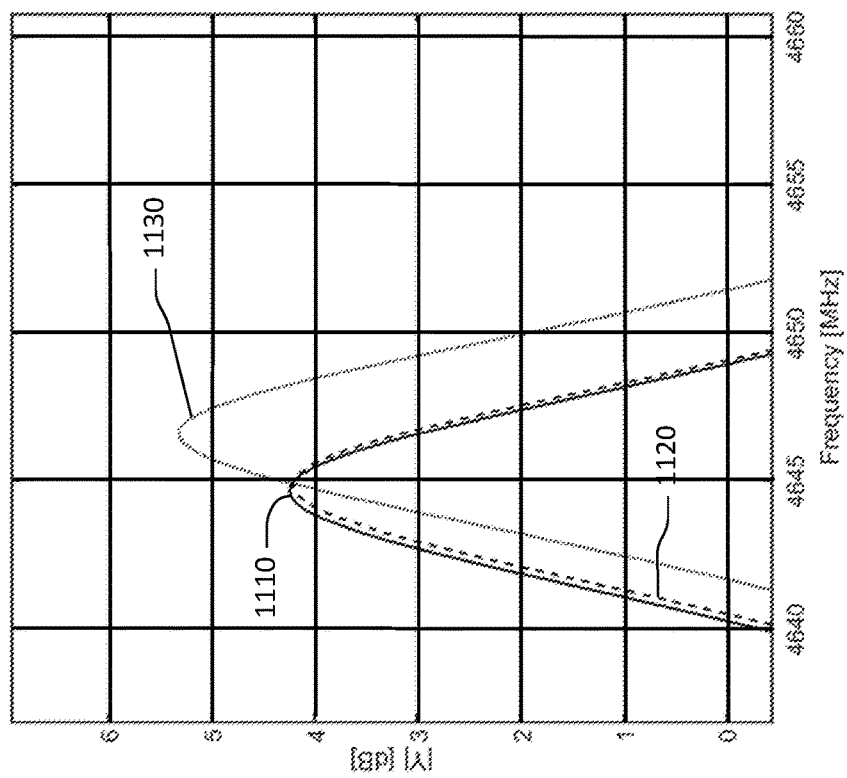
FIG. 11F is an enlarged view of a portion of FIG. 11A around a resonance frequency.

FIG. 11F is a chart 1100F showing an enlarged view of a portion of FIG. 11A around a resonance frequency. FIG. 11G is a chart 1100G showing an enlarged view of a portion of FIG. 11A around an anti-resonance frequency. These charts show that resonance and antiresonance frequencies can be substantially unaffected by variation in angle gamma.

Figure 12A:
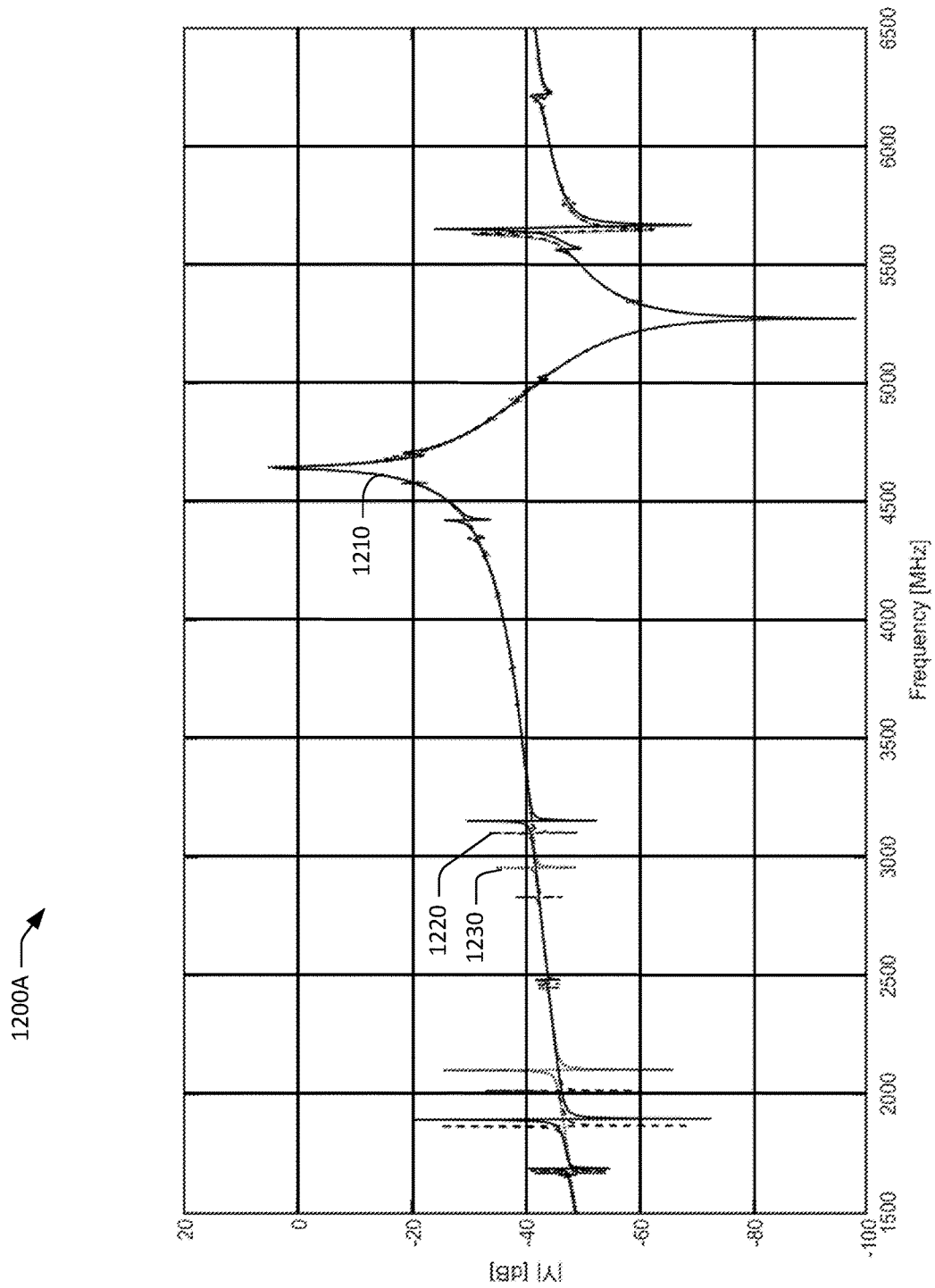
FIG. 12A is a graph of the magnitude of admittance versus frequency for XBARs with different angles theta of rotation to the X-axis of the piezoelectric plate.
Figure 12B:
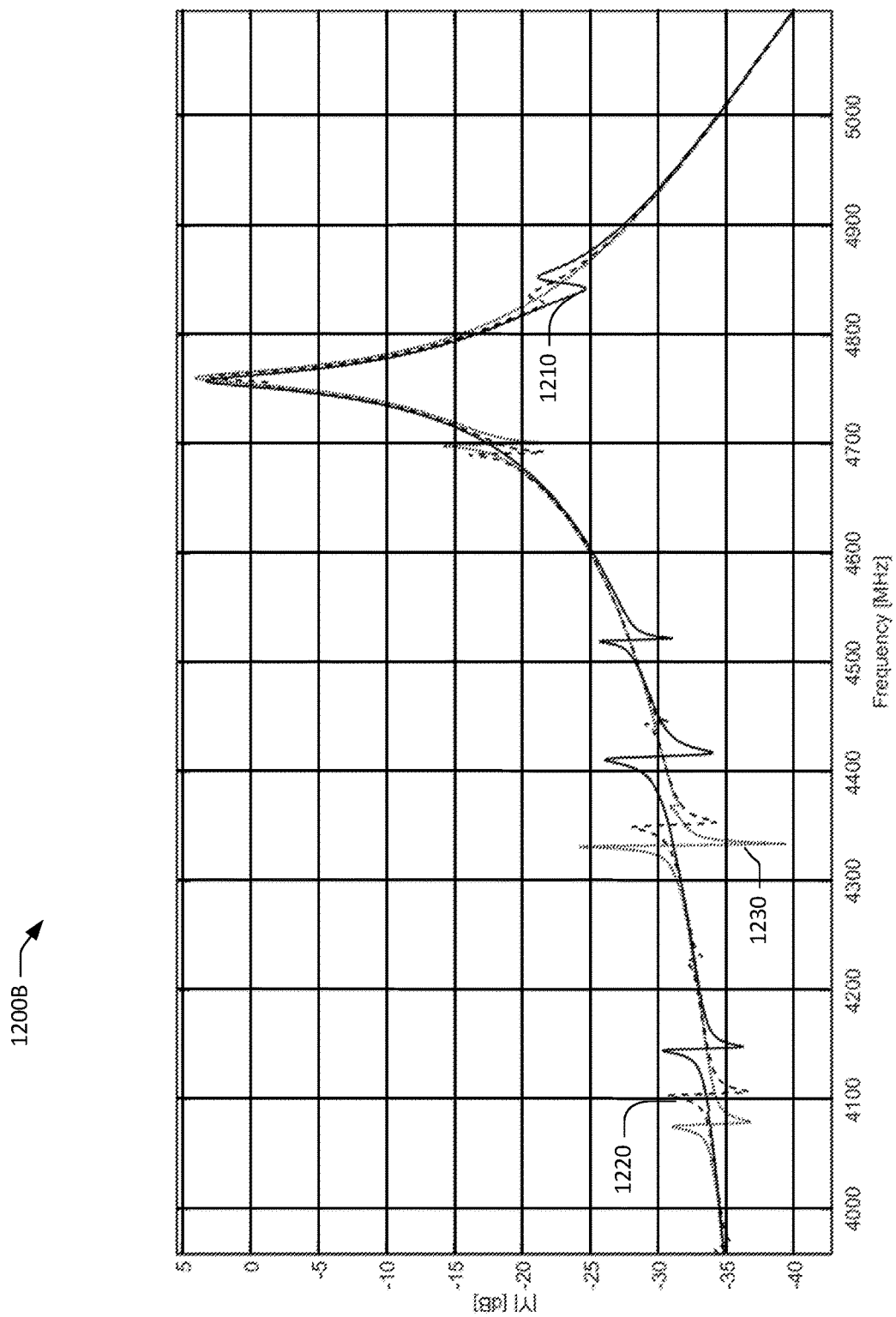
FIG. 12B is an enlarged view of a portion of FIG. 12A around a resonance frequency.

FIG. 12A is a chart 1200A of resonance and anti-resonance frequencies of other exemplary XBARs showing the magnitude of the admittance as a function of frequency for different angles gamma of rotation to the X-axis of the piezoelectric plate. For this XBAR on ZX-cut LN, p=3.5 um, mark=500 nm, tm=100 nm, is =400 nm, and tfd=0. The XBAR represented by solid curve 1210 has an angle gamma of 90 degrees. The XBAR represented by dash curve 1220 has an angle gamma of 75 degrees. The XBAR represented by dot curve 1230 has an angle gamma of 60 degrees. FIG. 12B is a chart 1200B showing an enlarged view of a portion of FIG. 12A around a resonance frequency. These charts show that varying the angle gamma can allow a designer to suppress spurs in certain frequency ranges without substantially varying a resonance frequency.

Acoustic RF filters usually incorporate multiple acoustic resonators. Typically, these resonators have at least two different resonance frequencies. For example, an RF filter using the well-known "ladder" filter architecture includes shunt resonators and series resonators. A shunt resonator typically has a resonance frequency below the passband of the filter and an anti-resonance frequency within the passband. A series resonator typically has a resonance frequency within the pass band and an anti-resonance frequency above the passband. In many filters, each resonator has a unique resonance frequency. An ability to obtain different resonance frequencies for XBARs made on the same piezoelectric plate greatly simplifies the design and fabrication of RF filters using XBARs.

Figure 13:
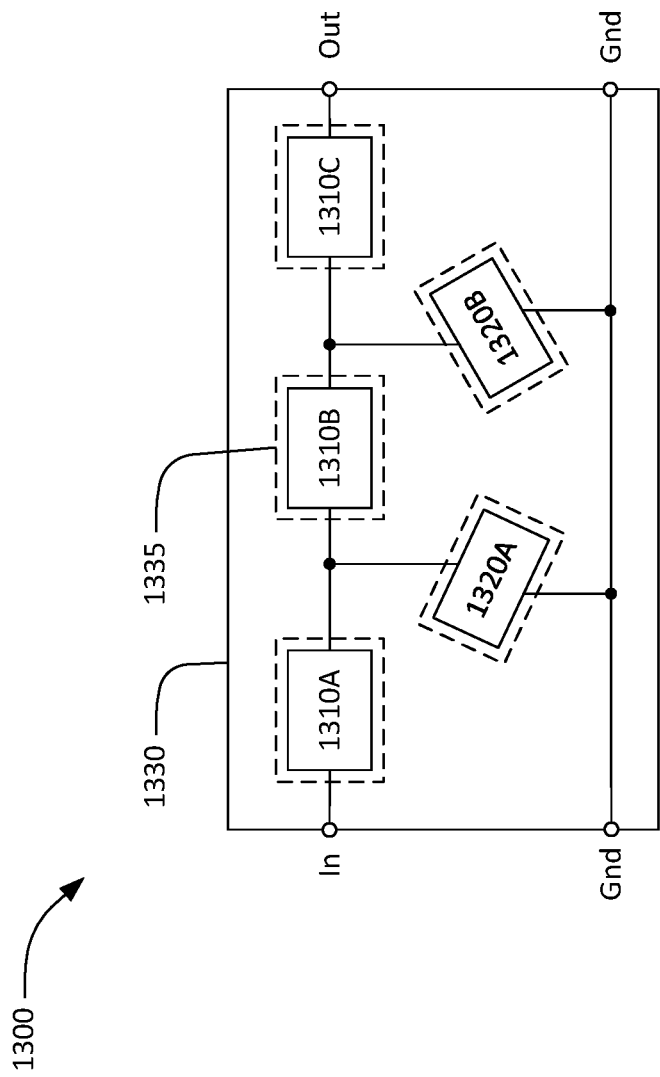
FIG. 13 is a schematic circuit diagram and layout of a filter using XBARs.

FIG. 13 is a schematic circuit diagram and layout for a high frequency band-pass filter 1300 using XBARs. The filter 1300 has a conventional ladder filter architecture including three series resonators 1310A, 1310B, 1310C and two shunt resonators 1320A, 1320B. The three series resonators 1310A, 1310B, and 1310C are connected in series between a first port and a second port. In FIG. 13, the first and second ports are labeled "In" and "Out", respectively. However, the filter 1300 is symmetrical and either port and serve as the input or output of the filter. The two shunt resonators 1320A, 1320B are connected from nodes between the series resonators to ground. All the shunt resonators and series resonators are XBARs. In the example of FIG. 13, the two shunt resonators 1320A, 1320B are rotated with respect to the series resonators 1310A, 1310B, 1310C. One, some, or all of the resonators in a filter may rotated at the same or different angles. The ability to rotate the resonators independently gives the filter designer an additional degree of design freedom to minimize spurious effects.

The three series resonators 1310A, B, C and the two shunt resonators 1320A, B of the filter 1300 are formed on a single plate 930 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 13, the cavities are illustrated schematically as the dashed rectangles (such as the rectangle 1335). In this example, each IDT is disposed over a respective cavity. In other filters, the IDTs of two or more resonators may be disposed over a single cavity.

Description of Methods

Figure 14:
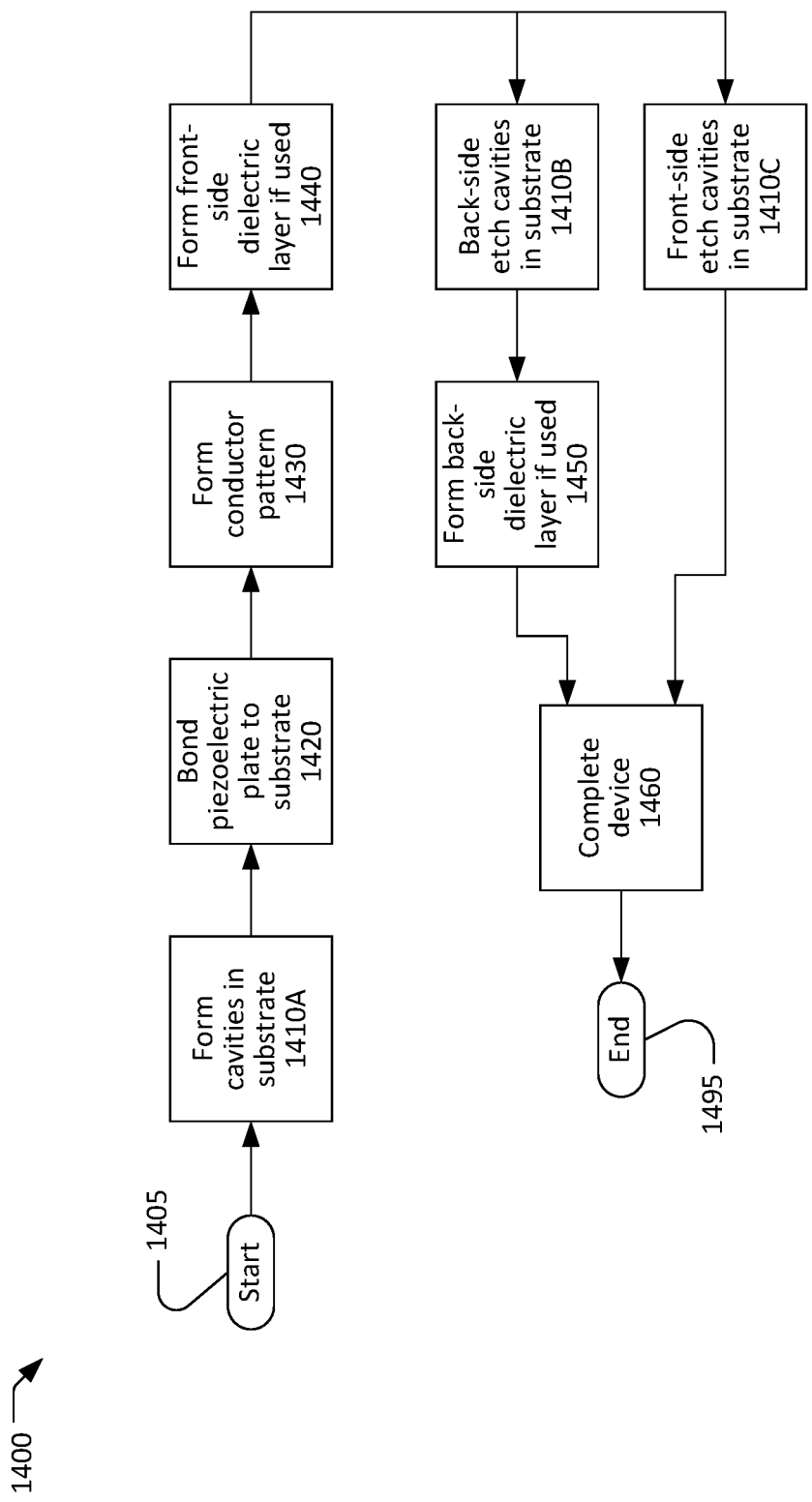
FIG. 14 is a flow chart of a process for fabricating an XBAR.

FIG. 14 is a simplified flow chart showing a process 1400 for making an XBAR or a filter incorporating XBARs. The process 1400 starts at 1405 with a substrate and a plate of piezoelectric material and ends at 1495 with a completed XBAR or filter. The flow chart of FIG. 14 includes only major process steps. Various conventional process steps (e.g. surface preparation, cleaning, inspection, baking, annealing, monitoring, testing, etc.) may be performed before, between, after, and during the steps shown in FIG. 14.

The flow chart of FIG. 14 captures three variations of the process 1400 for making an XBAR which differ in when and how cavities are formed in the substrate. The cavities may be formed at steps 1410A, 1410B, or 1410C. Only one of these steps is performed in each of the three variations of the process 1400.

The piezoelectric plate may be, for example, Z-cut lithium niobate or lithium tantalate as used in the previously presented examples. The piezoelectric plate may be some other material and/or some other cut. The substrate may preferably be silicon. The substrate may be some other material that allows formation of deep cavities by etching or other processing.

In one variation of the process 1400, one or more cavities are formed in the substrate at 1410A, before the piezoelectric plate is bonded to the substrate at 1420. A separate cavity may be formed for each resonator in a filter device. The one or more cavities may be formed using conventional photolithographic and etching techniques. Typically, the cavities formed at 1410A will not penetrate through the substrate, and the resulting resonator devices will have a cross-section as shown in FIG. 3A or FIG. 3B.

At 1420, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 1430 by depositing and patterning one or more conductor layer on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1430 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1430 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1440, a front-side dielectric layer may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

In a second variation of the process 1400, one or more cavities are formed in the back side of the substrate at 1410B. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In the second variation of the process 1400, a back-side dielectric layer may be formed at 1050. In the case where the cavities are formed at 1410B as holes through the substrate, the back-side dielectric layer may be deposited through the cavities using a convention deposition technique such as sputtering, evaporation, or chemical vapor deposition.

In a third variation of the process 1400, one or more cavities in the form of recesses in the substrate may be formed at 1410C by etching the substrate using an etchant introduced through openings in the piezoelectric plate. A separate cavity may be formed for each resonator in a filter device. The one or more cavities formed at 1410C will not penetrate through the substrate, and the resulting resonator devices will have a cross-section as shown in FIG. 3A or FIG. 3B.

In all variations of the process 1400, the filter device is completed at 1460. Actions that may occur at 1460 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1460 is to tune the resonant frequencies of the resonators within the device by adding or removing metal or dielectric material from the front side of the device. After the filter device is completed, the process ends at 1495.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:
1. An acoustic resonator device comprising:
   a substrate having a surface;

a single-crystal piezoelectric plate having front and back surfaces, the back surface attached to the surface of the substrate except for a portion of the piezoelectric plate forming a diaphragm that spans a cavity in the substrate; and an interdigital transducer (IDT) formed on the front surface of the single-crystal piezoelectric plate such that interleaved fingers of the IDT are disposed on the diaphragm, the IDT configured to excite a primary acoustic mode in the diaphragm in response to a radio frequency signal applied to the IDT, wherein the fingers of the IDT extend at an oblique angle to an Y crystalline axis of the piezoelectric plate, wherein the oblique angle is in a range between 60 degrees and 120 degrees.

2. The device of claim 1, wherein a direction of acoustic energy flow of the excited primary shear acoustic mode is substantially normal to the surfaces of the piezoelectric plate.

3. The device of claim 1, wherein a z-axis of the piezoelectric plate is normal to the front and back surfaces.

4. A filter device comprising:
a substrate having a surface;
a single-crystal piezoelectric plate having front and back surfaces, the back surface attached to the surface of the substrate, portions of the piezoelectric plate forming one or more diaphragms, each spanning a respective cavity of the one or more cavities in the substrate; and
a conductor pattern formed on the front surface, the conductor pattern including one or more interdigital transducers (IDTs) of a respective one or more resonators, wherein interleaved fingers of the one or more IDTs is disposed on a respective diaphragm of the one or more diaphragms, wherein the piezoelectric plate and the one or more IDTs are configured such that respective radio frequency signals applied to the one or more IDTs excite respective shear primary acoustic modes in the respective one or more diaphragms, and wherein the interleaved fingers of at least one of the one or more IDTs extend at an oblique angle to an Y crystalline axis of the piezoelectric plate, wherein the oblique angle is in a range between 60 degrees and 120 degrees.

5. The device of claim 1, wherein the piezoelectric plate is formed of lithium niobite.

6. The device of claim 5, further comprising a front-side dielectric layer formed on the front surface of the lithium niobate plate between the fingers of the IDT.

7. The device of claim 5, wherein a thickness between the front and back surfaces of the lithium niobate plate is greater than or equal to 200 nm and less than or equal to 1000 nm.

8. A method of fabricating a filter device on a piezoelectric plate having front and back surfaces, the back surface attached to a substrate, the method comprising:
forming one or more cavities in the substrate such that respective portions of the piezoelectric plate form one or more diaphragms, each suspended over a respective cavity of the one or more cavities;
forming a conductor pattern on the front surface, the conductor pattern including one or more interdigital transducers (IDTs) of a respective one or more resonators, wherein interleaved fingers of the one or more IDTs are disposed on a respective diaphragm of the one or more diaphragms, wherein the piezoelectric plate and the one or more IDTs are configured such that radio frequency signals applied to the one or more IDTs excite respective primary shear acoustic modes in the respective one or more diaphragms, and wherein the interleaved fingers of at least one of the one or more IDTs extend at an oblique angle to an Y crystalline axis of the piezoelectric plate, wherein the oblique angle is in a range between 60 degrees and 120 degrees.

9. The filter device of claim 4, wherein the one or more resonators includes a shunt resonator and a series resonator.

10. The filter device of claim 4, wherein respective directions of acoustic energy flow of each of the excited primary shear acoustic modes are substantially normal to the surfaces of the piezoelectric plate.

11. The method of claim 8, wherein the one or more resonators includes a shunt resonator and a series resonator.

12. The method of claim 8, wherein respective directions of acoustic energy flow of each of the excited primary shear acoustic modes are substantially normal to the surfaces of the piezoelectric plate.

13. The method of claim 8, wherein a z-axis of the piezoelectric plate is normal to the front and back surfaces.

14. The filter device of claim 4, wherein the piezoelectric plate is formed of lithium niobite.

15. The filter device of claim 4, wherein a z-axis of the piezoelectric plate is normal to the front and back surfaces.

* * * * *